(12) United States Patent
Mizoguchi et al.

(10) Patent No.: US 11,913,996 B2
(45) Date of Patent: Feb. 27, 2024

(54) ESTIMATION DEVICE, ESTIMATION METHOD, AND COMPUTER PROGRAM

(71) Applicant: GS Yuasa International Ltd., Kyoto (JP)

(72) Inventors: Yasunori Mizoguchi, Kyoto (JP); Yasuyuki Hamano, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 0 days.

(21) Appl. No.: 17/765,249

(22) PCT Filed: Oct. 2, 2020

(86) PCT No.: PCT/JP2020/037504
§ 371 (c)(1),
(2) Date: Mar. 30, 2022

(87) PCT Pub. No.: WO2021/066129
PCT Pub. Date: Apr. 8, 2021

(65) Prior Publication Data
US 2022/0349941 A1 Nov. 3, 2022

(30) Foreign Application Priority Data

Oct. 3, 2019 (JP) .................................. 2019-183338

(51) Int. Cl.
*G01R 31/367* (2019.01)
*G01R 31/392* (2019.01)
(Continued)

(52) U.S. Cl.
CPC ......... *G01R 31/367* (2019.01); *G01R 31/374* (2019.01); *G01R 31/3842* (2019.01);
(Continued)

(58) Field of Classification Search
None
See application file for complete search history.

(56) References Cited

U.S. PATENT DOCUMENTS 5,759,716 A 6/1998 Clough
2004/0008031 A1 1/2004 Arai et al.
(Continued)

FOREIGN PATENT DOCUMENTS

DE 102018131626 A1 6/2019
EP 2778697 A1 9/2014
(Continued)

OTHER PUBLICATIONS

International Search Report (ISR) dated Dec. 15, 2020 filed in PCT/JP2020/037504.

*Primary Examiner* — Jas A Sanghera
(74) *Attorney, Agent, or Firm* — RANKIN, HILL & CLARK LLP

(57) ABSTRACT

An estimation device includes: a derivation unit (31) configured to derive a derivation history based on a current, a voltage of a lead-acid battery and a temperature of the lead-acid battery; a specifying unit (31) configured to specify one or more physical quantities based on the derivation history, and one or more relationships selected from a first relationship between a first history and an amount of positive active material, a second relationship between a second history and a specific surface area of a positive electrode material, a third relationship between a third history and bulk density of the positive active material, a fourth relationship between a fourth history and positive active material particles in a cluster size, a fifth relationship between a fifth history and a cumulative amount of lead sulfate of a negative electrode material, a sixth relationship between a sixth history and a specific surface area of the negative electrode material, a seventh relationship between (Continued)

a seventh history and a corrosion amount of a positive electrode grid, an eighth relationship between an eighth history and resistivity of a positive electrode plate, and a ninth relationship between a ninth history and resistivity of a negative electrode plate; and an estimation unit (31) configured to estimate a degree of deterioration of the lead-acid battery.

12 Claims, 18 Drawing Sheets

(51) Int. Cl.
    *G01R 31/3842*      (2019.01)
    *G01R 31/374*      (2019.01)
    *H02J 7/00*      (2006.01)
    *H01M 10/42*      (2006.01)
    *H01M 10/48*      (2006.01)
    *H01M 10/06*      (2006.01)

(52) U.S. Cl.
    CPC ...... *G01R 31/392* (2019.01); *H01M 10/4285* (2013.01); *H01M 10/486* (2013.01); *H02J 7/005* (2020.01); *H02J 7/0048* (2020.01); *H01M 10/06* (2013.01)

(56) References Cited

U.S. PATENT DOCUMENTS

| | | |
|---|---|---|
| 2004/0076872 A1 | 4/2004 | Kinoshita et al. |
| 2011/0288691 A1 | 11/2011 | Abe et al. |
| 2013/0085696 A1 | 4/2013 | Xu et al. |
| 2014/0306667 A1 | 10/2014 | Mukaitani et al. |
| 2016/0023570 A1 | 1/2016 | Takeda et al. |
| 2016/0084918 A1* | 3/2016 | Hongo ............... G01R 31/3648 702/63 |
| 2019/0176639 A1 | 6/2019 | Kumar et al. |
| 2019/0204393 A1 | 7/2019 | Yamada |
| 2020/0189414 A1 | 6/2020 | Morita |
| 2020/0235441 A1* | 7/2020 | Rahimian ........... H01M 10/425 |

FOREIGN PATENT DOCUMENTS

| | | |
|---|---|---|
| JP | H0541062 U | 6/1993 |
| JP | 2004130909 A | 4/2004 |
| JP | 2004354050 A | 12/2004 |
| JP | 2005129251 A | 5/2005 |
| JP | 2006189436 A | 7/2006 |
| JP | 2009219172 A | 9/2009 |
| JP | 2013231441 A | 11/2013 |
| JP | 2014105995 A | 6/2014 |
| JP | 2015035299 A | 2/2015 |
| JP | 2016022907 A | 2/2016 |
| JP | 2016109639 A | 6/2016 |
| JP | 2018-48893 A | 3/2018 |
| JP | 2018045898 A | 3/2018 |
| JP | 2018-62253 A | 4/2018 |
| JP | 2019079629 A | 5/2019 |
| WO | 2000044062 A1 | 7/2000 |
| WO | 2009118910 A1 | 10/2009 |

\* cited by examiner

Fig. 5

| No. | Lifetime effective discharge capacity | Lifetime effective charge capacity | Lifetime effective overcharge capacity | Temperature cumulative value | Standing time | SOC stay time | Thickness of positive electrode grid | Diagnosis information | First physical quantity |
|---|---|---|---|---|---|---|---|---|---|
| 1 | | | | | | | | | 5 |
| 2 | | | | | | | | | 2 |
| 3 | | | | | | | | | 3 |
| ... | ... | ... | ... | ... | ... | ... | | | ... |

| Second physical quantity | Third physical quantity | Fourth physical quantity | Fifth physical quantity | Sixth physical quantity | Seventh physical quantity | Eighth physical quantity | Ninth physical quantity | Degree of deterioration |
|---|---|---|---|---|---|---|---|---|
| 5 | 5 | 5 | 1 | 1 | 1 | 5 | 1 | 9 |
| 2 | 2 | 2 | 1 | 1 | 5 | 2 | 1 | 8 |
| 3 | 3 | 3 | 3 | 3 | 1 | 3 | 3 | 10 |
| ... | ... | ... | ... | ... | ... | ... | ... | ... |

| No. | Lifetime effective discharge capacity | Lifetime effective charge capacity | Lifetime effective overcharge capacity | Temperature cumulative value | Standing time | SOC stay time | Thickness of positive electrode grid | Diagnosis information | First physical quantity |
|---|---|---|---|---|---|---|---|---|---|
| 1 | | | | | | | | | 0 |
| 2 | | | | | | | | | 1 |
| 3 | | | | | | | | | 2 |
| ... | ... | ... | ... | ... | | ... | | | ... |
| 10 | | | | | | | | | 3 |

| Second physical quantity | Third physical quantity | Fourth physical quantity | Fifth physical quantity | Sixth physical quantity | Seventh physical quantity | Eighth physical quantity | Ninth physical quantity | Degree of deterioration |
|---|---|---|---|---|---|---|---|---|
| 0 | 0 | 0 | 0 | 0 | 0 | 0 | 0 | 1 |
| 1 | 1 | 1 | 1 | 1 | 0 | 1 | 1 | 3 |
| 2 | 2 | 2 | 1 | 1 | ... | 2 | 1 | 4 |
| ... | ... | ... | ... | ... | ... | ... | | |
| 3 | 3 | 3 | 3 | 3 | 1 | 3 | 3 | 10 |

Fig. 9

| ID No. 1 | | | | | | | | |
|---|---|---|---|---|---|---|---|---|
| No. | Lifetime effective discharge capacity | Lifetime effective charge capacity | Lifetime effective overcharge capacity | Temperature cumulative value | Standing time | SOC stay time | Thickness of positive electrode grid | Diagnosis information |
| 1 | | | | | | | | |
| 2 | | | | | | | | |
| 3 | | | | | | | | |
| ... | ... | ... | ... | ... | ... | ... | | |
| 10 | | | | | | | | |

| First physical quantity | Second physical quantity | Third physical quantity | Fourth physical quantity | Fifth physical quantity | Sixth physical quantity | Seventh physical quantity | Eighth physical quantity | Ninth physical quantity |
|---|---|---|---|---|---|---|---|---|
| 0 | 0 | 0 | 0 | 0 | 0 | 0 | 0 | 0 |
| 1 | 1 | 1 | 1 | 1 | 1 | 0 | 1 | 1 |
| 2 | 2 | 2 | 2 | 1 | 1 | 1 | 2 | 1 |
| ... | ... | ... | ... | ... | ... | ... | ... | ... |
| 3 | 3 | 3 | 3 | 3 | 3 | 1 | 3 | 3 |

| Actually measured first physical quantity | Actually measured second physical quantity | Actually measured third physical quantity | Actually measured fourth physical quantity | Actually measured fifth physical quantity | Actually measured sixth physical quantity | Actually measured seventh physical quantity | Actually measured eighth physical quantity | Actually measured ninth physical quantity | Degree of deterioration | Actually measured degree of deterioration |
|---|---|---|---|---|---|---|---|---|---|---|
| 1 | 1 | 1 | 1 | 1 | 1 | 0 | 1 | | 1 | |
| 2 | 2 | 2 | 2 | 2 | 2 | 1 | 2 | | 3 | 3 |
| ... | ... | ... | ... | ... | ... | ... | ... | | 4 | 5 |
| | | | | | | | | | ... | ... |
| | | | | | | | | | 10 | |

Fig. 16

| No. | Lifetime effective discharge capacity | Lifetime effective charge capacity | Lifetime effective overcharge capacity | Temperature cumulative value | Standing time | SOC stay time | Current collection characteristics | | | Specific gravity of electrolyte solution | | |
|---|---|---|---|---|---|---|---|---|---|---|---|---|
| | | | | | | | Upper portion | Middle portion | Lower portion | Upper portion | Middle portion | Lower portion |
| 1 | ... | ... | ... | ... | | | 1 | 3 | 5 | 5 | 4 | |
| 2 | ... | ... | ... | ... | | | | | | | | 3 |
| 3 | ... | ... | ... | ... | | | | | | | | |
| ... | | | | | | | | | | | | |

| Thickness of positive electrode grid | Diagnosis information | First physical quantity | Second physical quantity | Third physical quantity | Fourth physical quantity | Fifth physical quantity | | |
|---|---|---|---|---|---|---|---|---|
| | | | | | | Upper portion | Middle portion | Lower portion |
| | | ... | ... | ... | ... | 3 | 4 | 5 |
| | | | | | | | | ... |

| Sixth physical quantity | Seventh physical quantity | | | Eighth physical quantity | Ninth physical quantity | Degree of deterioration | | | |
|---|---|---|---|---|---|---|---|---|---|
| | Upper portion | Middle portion | Lower portion | | | Upper portion | Middle portion | Lower portion | Comprehensive |
| | 5 | 4 | 3 | | | 8 | 7 | 8 | 9 |
| | ... | | | | ... | | | | ... |

ESTIMATION DEVICE, ESTIMATION METHOD, AND COMPUTER PROGRAM

TECHNICAL FIELD

The present invention relates to an estimation device, an estimation method, and a computer program for estimating deterioration of a lead-acid battery.

BACKGROUND ART

Lead-acid batteries are used in various applications in addition to in-vehicle applications and industrial applications. For example, a secondary battery (energy storage device) such as an in-vehicle lead-acid battery is mounted on a moving body such as a vehicle. Here, the vehicle includes an automobile, a motorcycle, a forklift, or a golf car, for example. The secondary battery is used as a power supply source that supplies electricity to a starter motor at the time of starting an engine, and a power supply source that supplies electricity to various electrical components such as lights. For example, a lead-acid battery for industrial use is used as an emergency power supply source or as a power supply source to an uninterruptable power system (UPS).

It has been known that deterioration of a lead-acid battery progresses due to various factors. To prevent stopping of the supply of electricity caused by the occurrence of a state where a lead-acid battery unexpectedly loses its function, it is necessary to appropriately determine the degree of deterioration.

Patent Document 1 discloses a deterioration determination device that calculates an internal resistance based on a current and a voltage of a lead-acid battery, and determines the deterioration of the lead-acid battery based on the internal resistance.

PRIOR ART DOCUMENT

Patent Document

Patent Document 1: JP-A-2016-109639

SUMMARY OF THE INVENTION

Problems to be Solved by the Invention

Main factors that cause the deterioration of a lead-acid battery are softening of a positive active material, corrosion of a positive electrode grid, sulfation of a negative electrode, shrinkage of a negative active material, and the like. There has been a demand for a means that can favorably estimate the degree of deterioration of the entire lead-acid battery by estimating the degree of the deterioration caused by corresponding deterioration factors.

Accordingly, it is an object of the present invention to provide an estimation device, an estimation method, and a computer program for estimating the degree of deterioration of a lead-acid battery.

Means for Solving the Problems

An estimation device according to the present invention includes: a derivation unit configured to derive a derivation history based on a current, a voltage of a lead-acid battery and a temperature of the lead-acid battery; a specifying unit configured to specify at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate, based on the derivation history and at least one relationship selected from a group consisting of a first relationship between a first history based on the current, the voltage of the lead-acid battery and the temperature of the lead-acid battery and the first physical quantity, a second relationship between a second history based on the current, the voltage of the lead-acid battery and the temperature of the lead-acid battery and the second physical quantity, a third relationship between a third history based on the current, the voltage of the lead-acid battery and the temperature of the lead-acid battery and the third physical quantity, a fourth relationship between a fourth history based on the current, the voltage of the lead-acid battery and the temperature of the lead-acid battery and the fourth physical quantity, a fifth relationship between a fifth history based on the current, the voltage of the lead-acid battery and the temperature of the lead-acid battery and the fifth physical quantity, a sixth relationship between a sixth history based on the current, the voltage of the lead-acid battery and the temperature of the lead-acid battery and the sixth physical quantity, a seventh relationship between a seventh history based on the current, the voltage of the lead-acid battery and the temperature of the lead-acid battery and the seventh physical quantity, an eighth relationship between an eighth history based on the current, the voltage of the lead-acid battery and the temperature of the lead-acid battery and the eighth physical quantity, and a ninth relationship between a ninth history based on the current, the voltage of the lead-acid battery and the temperature of the lead-acid battery and the ninth physical quantity; and an estimation unit configured to estimate a degree of deterioration of the lead-acid battery based on the specified at least one physical quantity.

An estimation method according to the present invention includes the steps of: deriving a derivation history based on a current, a voltage of a lead-acid battery and a temperature of the lead-acid battery; specifying at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate, based on the derivation history and at least one relationship selected from a group consisting of a first relationship between a first history based on the current, the voltage of the lead-acid battery and the temperature of the lead-acid battery and the first physical quantity, a second relationship between a second history based on the current, the voltage of the lead-acid battery and the temperature of the lead-acid battery and the second physical quantity, a third relationship between a third history based on the current, the voltage of the lead-acid battery and the temperature of the lead-acid battery and the third physical quantity, a fourth relationship between a fourth history based on the current, the voltage of the lead-acid battery and the temperature of the lead-acid battery and the fourth physical quantity, a fifth relationship between a fifth history based on the current, the voltage of the lead-acid battery and the temperature of the lead-acid battery and the fifth physical quantity, a sixth relationship between a sixth history based on the current, the voltage of the lead-acid battery and the temperature of the lead-acid battery and the sixth physical quantity, a seventh relationship between a seventh history based on the current, the voltage of the lead-acid battery and the temperature of the lead-acid battery and the seventh physical quantity, an eighth relationship between an eighth history based on the current, the voltage of the lead-acid battery and the temperature of the lead-acid battery and the eighth physical quantity, and a ninth relationship between a ninth history based on the current, the voltage of the lead-acid battery and the temperature of the lead-acid battery and the ninth physical quantity; and estimating a degree of deterioration of the lead-acid battery based on the specified at least one physical quantity.

A computer program according to the present invention enables a computer to execute processing including: deriving a derivation history based on a current, a voltage of a lead-acid battery and a temperature of the lead-acid battery; specifying at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate, based on the derivation history, and at least one relationship selected from a group consisting of a first relationship between a first history based on the current, the voltage of the lead-acid battery and the temperature of the lead-acid battery and the first physical quantity, a second relationship between a second history based on the current, the voltage of the lead-acid battery and the temperature of the lead-acid battery and the second physical quantity, a third relationship between a third history based on the current, the voltage of the lead-acid battery and the temperature of the lead-acid battery and the third physical quantity, a fourth relationship between a fourth history based on the current, the voltage of the lead-acid battery and the temperature of the lead-acid battery and the fourth physical quantity, a fifth relationship between a fifth history based on the current, the voltage of the lead-acid battery and the temperature of the lead-acid battery and the fifth physical quantity, a sixth relationship between a sixth history based on the current, the voltage of the lead-acid battery and the temperature of the lead-acid battery and the sixth physical quantity, a seventh relationship between a seventh history based on the current, the voltage of the lead-acid battery and the temperature of the lead-acid battery and the seventh physical quantity, an eighth relationship between an eighth history based on the current, the voltage of the lead-acid battery and the temperature of the lead-acid battery and the eighth physical quantity, and a ninth relationship between a ninth history based on the current, the voltage of the lead-acid battery and the temperature of the lead-acid battery and the ninth physical quantity; and estimating a degree of deterioration of the lead-acid battery based on the at least one specified physical quantity specified.

BRIEF DESCRIPTION OF THE DRAWINGS

FIG. 5 is an explanatory view illustrating one example of a record layout of a degree-of-deterioration database (DB).

FIG. 6 is an explanatory view illustrating one example of a record layout of a use history DB.

FIG. 9 is an explanatory view illustrating one example of a record layout of a use history DB.

FIG. 16 is an explanatory view illustrating one example of a record layout of a degree-of-deterioration DB.

MODE FOR CARRYING OUT THE INVENTION

Overall View of the Embodiment

Figure 1:
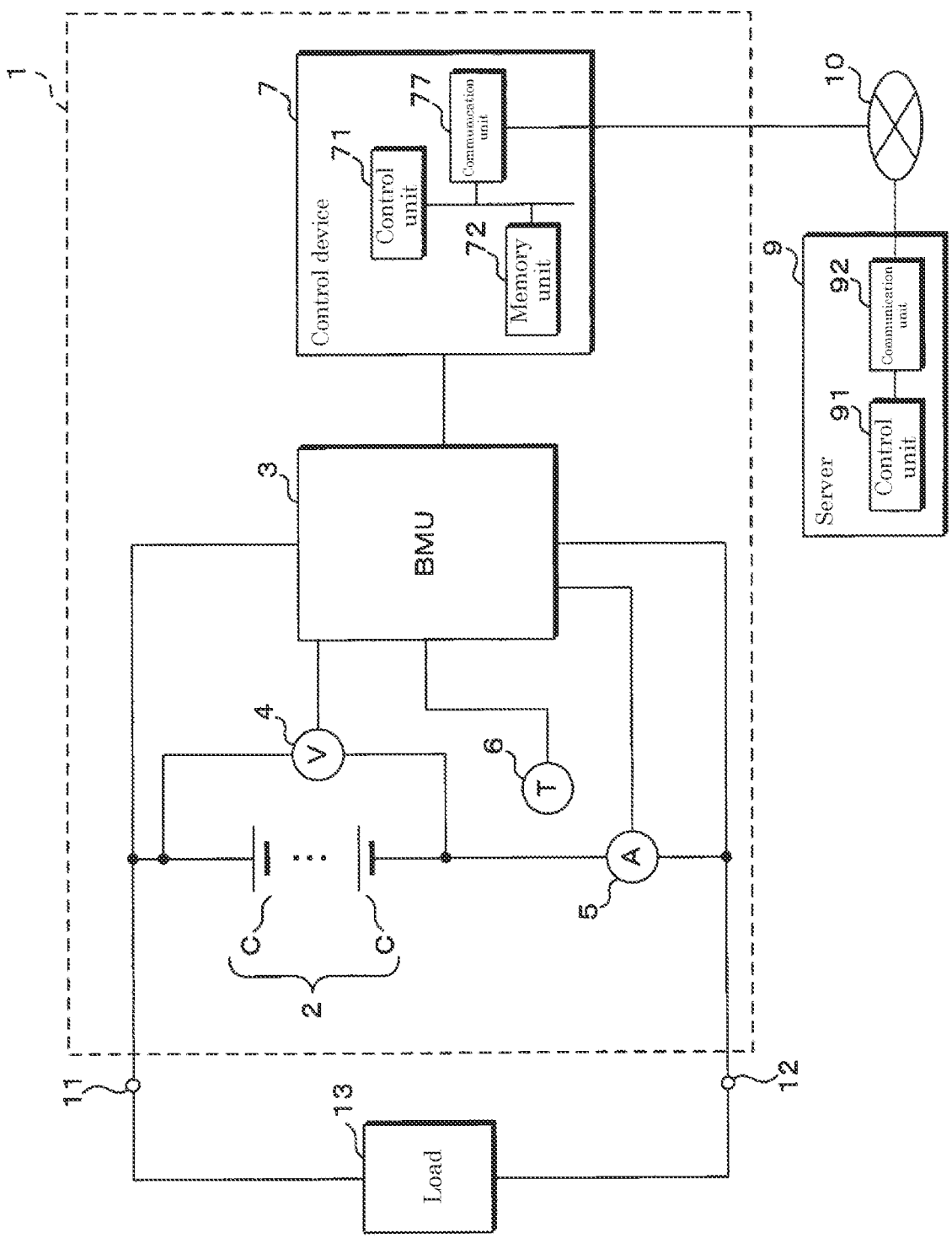
FIG. 1 is a block diagram illustrating the configuration of a charge-discharge system, a load and a server according to an embodiment 1.

An estimation device according to the embodiment includes: a derivation unit configured to derive a derivation history based on a current, a voltage of a lead-acid battery and a temperature of the lead-acid battery; a specifying unit configured to specify at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate, based on the derivation history and at least one relationship selected from a group consisting of a first relationship between a first history based on the current, the voltage of the lead-acid battery and the temperature of the lead-acid battery and the first physical quantity, a second relationship between a second history based on the current, the voltage of the lead-acid battery and the temperature of the lead-acid battery and the second physical quantity, a third relationship between a third history based on the current, the voltage of the lead-acid battery and the temperature of the lead-acid battery and the third physical quantity, a fourth relationship between a fourth history based on the current, the voltage of the lead-acid battery and the temperature of the lead-acid battery and the fourth physical quantity, a fifth relationship between a fifth history based on the current, the voltage of the lead-acid battery and the temperature of the lead-acid battery and the fifth physical quantity, a sixth relationship between a sixth history based on the current, the voltage of the lead-acid battery and the temperature of the lead-acid battery and the sixth physical quantity, a seventh relationship between a seventh history based on the current, the voltage of the lead-acid battery and the temperature of the lead-acid battery and the seventh physical quantity, an eighth relationship between an eighth history based on the current, the voltage of the lead-acid battery and the temperature of the lead-acid battery and the eighth physical quantity, and a ninth relationship between a ninth history based on the current, the voltage of the lead-acid battery and the temperature of the lead-acid battery and the ninth physical quantity; and an estimation unit configured to estimate a degree of deterioration of the lead-acid battery based on the at least one specified physical quantity specified.

In this specification, the bulk density of the positive electrode material means a mass per an apparent volume of a positive electrode that is porous.

The first history, the second history, the third history, the fourth history, the fifth history, the sixth history, the seventh history, the eighth history, and the ninth history may be the same or different from each other. For example, in the case of the first history, the second history, the third history, and the fourth history, each history includes histories of a lifetime effective discharge capacity, a temperature cumulative value, a use period, and the like. In the case of the fifth history and the sixth history, each history includes histories of a lifetime effective discharge capacity, a lifetime effective charge capacity, a temperature cumulative value, and a use period, a standing time, a stay time in each state of charge (SOC) section, and the like. In the case of the seventh history and the eighth history, each history includes histories of a lifetime effective discharge capacity, a temperature cumulative value, a use period, a lifetime effective overcharge capacity, and the like. In the case of the ninth history, the history includes histories of a lifetime effective charge capacity, a temperature cumulative value, a use period, a standing time, a stay time in each SOC section, and the like.

According to the above-mentioned configuration, histories based on a current, a voltage, and a temperature are derived. One or more physical quantities are specified based on the relationship between the derivation histories and a first physical quantity, a second physical quantity, a third physical quantity, a fourth physical quantity, a fifth physical quantity, a sixth physical quantity, a seventh physical quantity, an eighth physical quantity or a ninth physical quantity that is preliminarily obtained, and the degree of deterioration of a lead-acid battery is estimated based on the specified physical quantity. The physical quantity reflects the degree of the deterioration factor. The first physical quantity, the second physical quantity, the third physical quantity, and the fourth physical quantity correspond to the degree of softening of the positive electrode material. The seventh physical quantity corresponds to the degree of corrosion of the positive electrode grid. The eighth physical quantity corresponds to the degree of softening of the positive electrode material and the degree of corrosion of the positive electrode grid. The fifth physical quantity, the sixth physical quantity, and the ninth physical quantity correspond to the degree of sulfation of the negative electrode. The sixth physical quantity and the ninth physical quantity correspond to the degree of sulfation of the negative electrode and the degree of shrinkage of the negative electrode. The deterioration of the lead-acid battery can be satisfactorily estimated by specifying these physical quantities. By predicting the deterioration of the lead-acid battery, it is possible to estimate a risk of a failure in the battery. Accordingly, it is possible to avoid the occurrence of a case where a battery suddenly falls into an unusable state.

Deterioration of the lead-acid battery can also be estimated by combining two or more physical quantities.

For example, it is possible to satisfactorily predict rapid deterioration of the lead-acid battery caused by simultaneous progress of deterioration of the positive electrode plate and deterioration of the negative electrode plate. Furthermore, even in a case where a single deterioration of the lead-acid battery progresses, it is possible to increase reliability of prediction by predicting deterioration by using estimated values of a plurality of physical quantities. Furthermore, the deterioration of the lead-acid battery can be satisfactorily predicted even when a use history that adversely affects only one deterioration factor occurs and, thereafter, a use history that adversely affects only a deterioration factor that differs from the former deterioration factor occurs, or when such a use history pattern is repeated.

In the above-mentioned estimation device, the specifying unit may specify at least one physical quantity out of the first physical quantity to the ninth physical quantity based on the relationship between the history corresponding to the position of the plate in a height direction and the physical quantity at the position.

In the lead-acid battery, electricity is collected from an upper portion of a current collector. Accordingly, an upper portion of the positive electrode grid is liable to be charged and discharged so that the upper portion of the positive electrode grid is liable to corrode.

For example, when charging is performed after discharging with a depth of discharge (DOD) of 50%, charging is liable to be performed at an upper portion of the negative electrode, and charging is difficult to be performed at a lower portion of the negative electrode. Therefore, an amount of lead sulfate (fifth physical quantity) decreases in the upper portion of the negative electrode, and increases in the lower portion of the negative electrode. Accordingly, there is a possibility that the sulfation of the negative electrode occurs.

When the specific gravity of the electrolyte solution is stratified (vertical differentiation in specific gravity of electrolyte solution) occurs, a vertical differentiation in sulfation of the negative electrode also occurs.

With such a configuration, the physical quantity can be specified corresponding to the position in the height direction, and the deterioration of the lead-acid battery can be estimated also in consideration of the difference in physical quantity in the height direction.

In the above-mentioned estimation device, the derivation history may include: an effective discharge capacity obtained by correcting a discharge capacity by a coefficient based on a temperature, an effective charge capacity obtained by correcting a charge capacity by a coefficient based on a temperature; or a temperature cumulative value obtained by multiplying a temperature by a predetermined coefficient.

The coefficient for correction may include not only a temperature but also a discharge capacity, a current value, and a capacity.

With such a configuration, the physical quantity can be specified satisfactorily.

In the above-mentioned estimation device, the specifying unit may specify at least one physical quantity by inputting the derivation history derived by the derivation unit into a first learning model that is configured to output at least one physical quantity out of the first physical quantity, the second physical quantity, the third physical quantity, the fourth physical quantity, the fifth physical quantity, the sixth physical quantity, the seventh physical quantity, the eighth physical quantity, and the ninth physical quantity, when a derivation history based on a current, a voltage of the lead-acid battery and a temperature of the lead-acid battery is inputted to the first learning model.

With such a configuration, the physical quantity can be easily and satisfactorily specified using the first learning model.

In the above-mentioned estimation device, the estimation unit may estimate a degree of deterioration by inputting the at least one specified physical quantity to a second learning model that outputs the degree of deterioration of the lead-acid battery when at least one physical quantity out of the first physical quantity, the second physical quantity, the third physical quantity, the fourth physical quantity, the fifth physical quantity, the sixth physical quantity, the seventh physical quantity, the eighth physical quantity, and the ninth physical quantity is inputted to the second learning model.

With such a configuration, the degree of the deterioration of the lead-acid battery can be easily and satisfactorily estimated using the second learning model.

In the above-mentioned estimation device, the specifying unit may specify the at least one physical quantity based on the derivation history and design information on the lead-acid battery.

With such a configuration, the physical quantity can be specified satisfactorily also in consideration of the design information.

In the above-mentioned estimation device, the design information may be at least one selected from a group consisting of the number of plates, the amount of the positive active material, a mass of the positive electrode grid, a thickness of the positive electrode grid, a design of the positive electrode grid, density of the positive electrode material, composition of the positive electrode material, an amount and a kind of an additive in the positive active material, composition of a positive electrode alloy, a presence or non-presence, a thickness, a material and gas permeability of a non-woven fabric that is brought into contact with the positive electrode plate, the negative active material, an amount and a kind of carbon in the negative electrode material, an amount and a kind of an additive in the negative electrode material, a specific surface area of the negative electrode material, a kind and concentration of an additive in an electrolyte solution, and a specific gravity and an amount of the electrolyte solution.

With such a configuration, the physical quantity can be specified satisfactorily.

In the above-mentioned estimation device, the estimation unit may estimate the degree of deterioration based on the at least one physical quantity and diagnosis information of the lead-acid battery.

With the above-mentioned configuration, the degree of deterioration can be estimated satisfactorily also in consideration of the diagnosis information.

In the above-mentioned estimation device, the diagnosis information may be at least one selected from a group consisting of internal resistance, an open circuit voltage (OCV), and a state of charge (SOC).

With such a configuration, the degrees of deterioration factors can be specified satisfactorily.

The above-mentioned estimation device may further includes: a memory unit configured to store the derivation history, and the degree of deterioration or the diagnosis information that the specifying unit specifies; and a history erasing unit configured to erase the derivation history, and the degree of deterioration or the diagnosis information, when determination is made that the lead-acid battery is exchanged based on the degree of deterioration or the diagnosis information, and a threshold value.

In this specification, erasing of the history includes not only erasing of information stored in the memory unit but also setting a start point of time of multiplication in calculating the derivation history to a point of time that the determination is made that the lead-acid battery is exchanged.

With such a configuration, when it is determined that the deterioration of the lead-acid battery has progressed based on the degree of deterioration or the diagnosis information, and the lead-acid battery is exchanged, for example, data of a use history DB described later can be reset.

An estimation method according to the embodiment includes the steps of; deriving a derivation history based on a current, a voltage of a lead-acid battery and a temperature of the lead-acid battery; specifying at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate, based on the derived derivation history and at least one relationship selected from a group consisting of a first relationship between a first history based on the current, the voltage of the lead-acid battery and the temperature of the lead-acid battery and the first physical quantity, a second relationship between a second history based on the current, the voltage of the lead-acid battery and the temperature of the lead-acid battery and the second physical quantity, a third relationship between a third history based on the current, the voltage of the lead-acid battery and the temperature of the lead-acid battery and the third physical quantity, a fourth relationship between a fourth history based on the current, the voltage of the lead-acid battery and the temperature of the lead-acid battery and the fourth physical quantity, a fifth relationship between a fifth history based on the current, the voltage of the lead-acid battery and the temperature of the lead-acid battery and the fifth physical quantity, a sixth relationship between a sixth history based on the current, the voltage of the lead-acid battery and the temperature of the lead-acid battery and the sixth physical quantity, a seventh relationship between a seventh history based on the current, the voltage of the lead-acid battery and the temperature of the lead-acid battery and the seventh physical quantity, an eighth relationship between an eighth history based on the current, the voltage of the lead-acid battery and the temperature of the lead-acid battery and the eighth physical quantity, and a ninth relationship between a ninth history based on the current, the voltage of the lead-acid battery and the temperature of the lead-acid battery and the ninth physical quantity; and estimating a degree of deterioration of the lead-acid battery based on the at least one specified physical quantity.

With such a configuration, the derivation histories based on a current, a voltage and a temperature are derived, one or more physical quantities are specified based on the relationship between the derivation histories and the physical quantities that are preliminarily obtained, and the degree of deterioration of the lead-acid battery is estimated based on one or more specified physical quantities. The deterioration of the lead-acid battery can be satisfactorily estimated by specifying physical quantities that reflect deterioration factors such as corrosion of the positive electrode grid, softening of the positive electrode material, sulfation of the negative electrode, and shrinkage of a negative electrode material. By predicting the deterioration of the lead-acid battery, it is possible to estimate a risk of a failure in the battery. Accordingly, it is possible to avoid the occurrence of a case where a battery suddenly falls into an unusable state.

A computer program according to the embodiment enables a computer to execute processing consisting of; deriving a derivation history based on a current, a voltage of a lead-acid battery and a temperature of the lead-acid battery; specifying at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate, based on the derived derivation history and at least one relationship selected from a group consisting of a first relationship between a first history based on the current, the voltage of the lead-acid battery and the temperature of the lead-acid battery and the first physical quantity, a second relationship between a second history based on the current, the voltage of the lead-acid battery and the temperature of the lead-acid battery and the second physical quantity, a third relationship between a third history based on the current, the voltage of the lead-acid battery and the temperature of the lead-acid battery and the third physical quantity, a fourth relationship between a fourth history based on the current, the voltage of the lead-acid battery and the temperature of the lead-acid battery and the fourth physical quantity, a fifth relationship between a fifth history based on the current, the voltage of the lead-acid battery and the temperature of the lead-acid battery and the fifth physical quantity, a sixth relationship between a sixth history based on the current, the voltage of the lead-acid battery and the temperature of the lead-acid battery and the sixth physical quantity, a seventh relationship between a seventh history based on the current, the voltage of the lead-acid battery and the temperature of the lead-acid battery and the seventh physical quantity, an eighth relationship between an eighth history based on the current, the voltage of the lead-acid battery and the temperature of the lead-acid battery and the eighth physical quantity, and a ninth relationship between a ninth history based on the current, the voltage of the lead-acid battery and the temperature of the lead-acid battery and the ninth physical quantity; and estimating a degree of deterioration of the lead-acid battery based on the at least one specified physical quantity.

Embodiment 1

Figure 2:
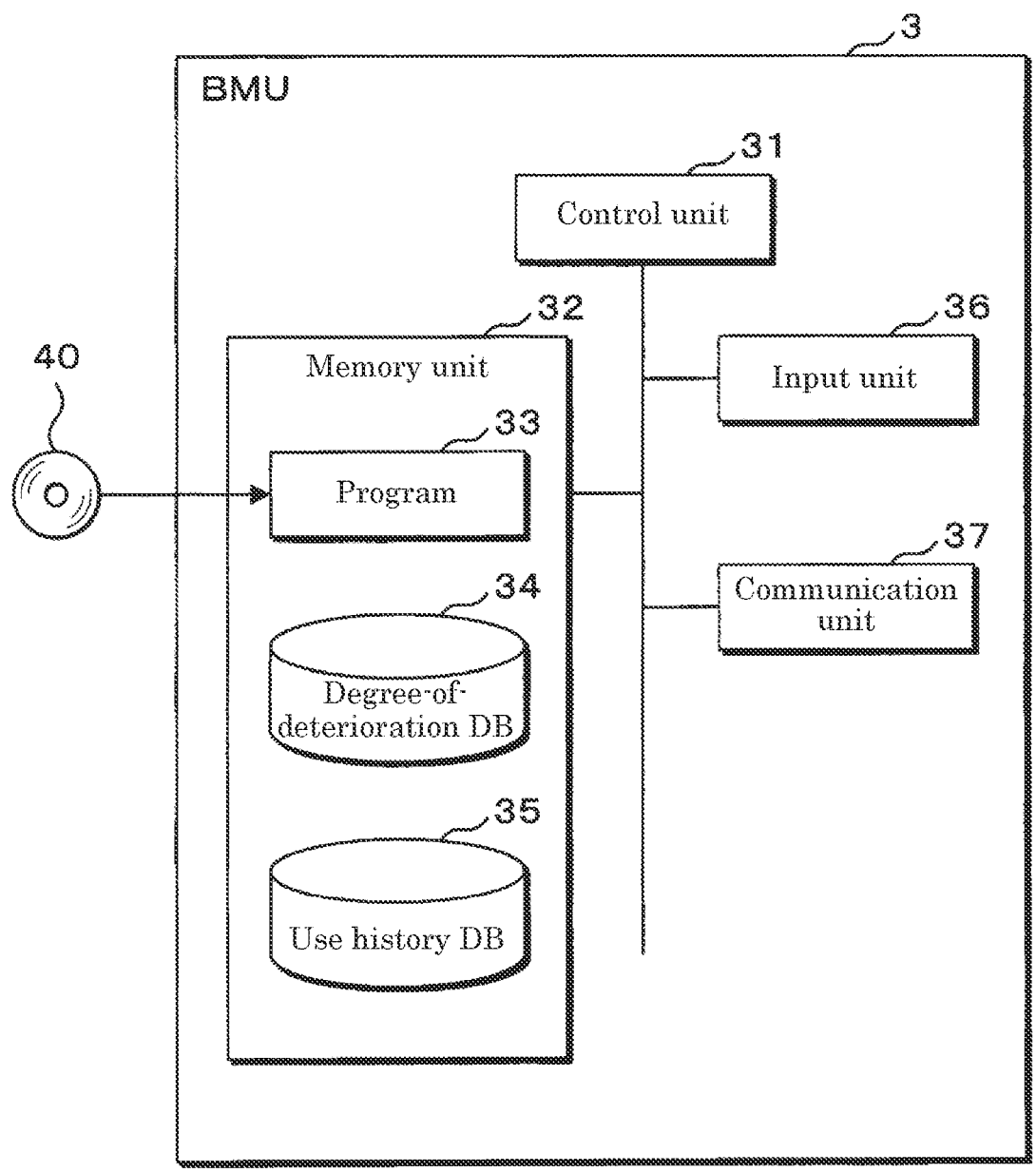
FIG. 2 is a block diagram illustrating the configuration of a battery management unit (BMU).

FIG. 1 is a block diagram illustrating the configuration of a charge-discharge system 1, a load 13, and a server 9 according to an embodiment 1. FIG. 2 is a block diagram illustrating the configuration of the BMU 3.

The charge-discharge system 1 includes a lead-acid battery (hereinafter referred to as battery) 2, the BMU 3, a voltage sensor 4, a current sensor 5, a temperature sensor 6, and a control device 7.

The BMU 3 includes a control unit 31, a memory unit 32, an input unit 36, and a communication unit 37. The BMU 3 may be a battery electronic control unit (ECU).

The control device 7 controls the entire charge-discharge system 1, and includes a control unit 71, a memory unit 72, and a communication unit 77.

The server 9 includes a control unit 91 and a communication unit 92.

The control unit 71 of the control device 7 is connected to the control unit 91 via the communication unit 77, a network 10, and the communication unit 92.

The battery 2 is connected to the load 13 via terminals 11 and 12.

The control units 31, 71, and 91 each include, for example, a central processing unit (CPU), a read only memory (ROM), a random access memory (RAM), and the like, and controls the operations of the BMU 3, the control device 7, and the server 9.

The memory unit 32 and the memory unit 72 are each formed of a hard disk drive (HDD) and the like, for example, and each store various programs and data.

The communication units 37, 77, and 92 each have a function of performing communication with other devices via a network, and can transmit and receive necessary information with other devices.

A program 33 for estimating deterioration is stored in the memory unit 32 of the BMU 3. The program 33 is provided in a state where the program 33 is stored in a computer-readable recording medium 40 such as a CD-ROM, a DVD-ROM, or a USB memory, for example. The program 33 is stored in the memory unit 32 by being installed in the BMU 3. Further, the program 33 may be acquired from an external computer (not illustrated) that is connected to a communication network, and may be stored in the memory unit 32.

The memory unit 32 also stores: a degree-of-deterioration DB 34 that stores histories, physical quantities, and the degrees of deterioration of the batteries 2; and a use history DB 35 that stores derivation histories, physical quantities and the degrees of deterioration of the respective batteries 2. Details of the degree-of-deterioration DB 34 and the use history DB 35 will be described later.

The input unit 36 receives inputting of detection results from the voltage sensor 4, a current sensor 5, and a temperature sensor 6.

In the embodiment, the BMU 3 functions as the estimation device according to the present invention. Either the control device 7 or the server 9 may function as the estimation device. Even when the BMU 3 functions as the estimation device, it is not always necessary that the memory unit 32 includes all of the program 33, the degree-of-deterioration DB 34, and the use history DB 35. Any or all of the program 33, the degree-of-deterioration DB 34, and the use history DB 35 may be included in the control device 7 or may be included in the server 9 in conformity with the embodiment. When the server 9 does not function as the estimation device, the charge-discharge system 1 may not be connected to the server 9.

The voltage sensor 4 is connected in parallel to the battery 2, and outputs a detection result corresponding to an entire voltage of the battery 2.

The current sensor 5 is connected in series with the battery 2, and outputs a detection result corresponding to a current of the battery 2. As the current sensor 5, for example, a current sensor such as a clamp type current sensor that is not electrically connected to the battery 2 can also be used.

The temperature sensor 6 is disposed in the vicinity of the battery 2, and outputs a detection result corresponding to the temperature of the battery 2. For prediction of deterioration of the battery 2, it is preferable to use a temperature of an electrolyte solution of the battery 2 as the temperature of the battery 2. Therefore, the temperature correction may be performed such that a temperature detected by the temperature sensor 6 becomes the temperature of the electrolyte solution depending on the position where the temperature sensor 6 is disposed.

Figure 3:
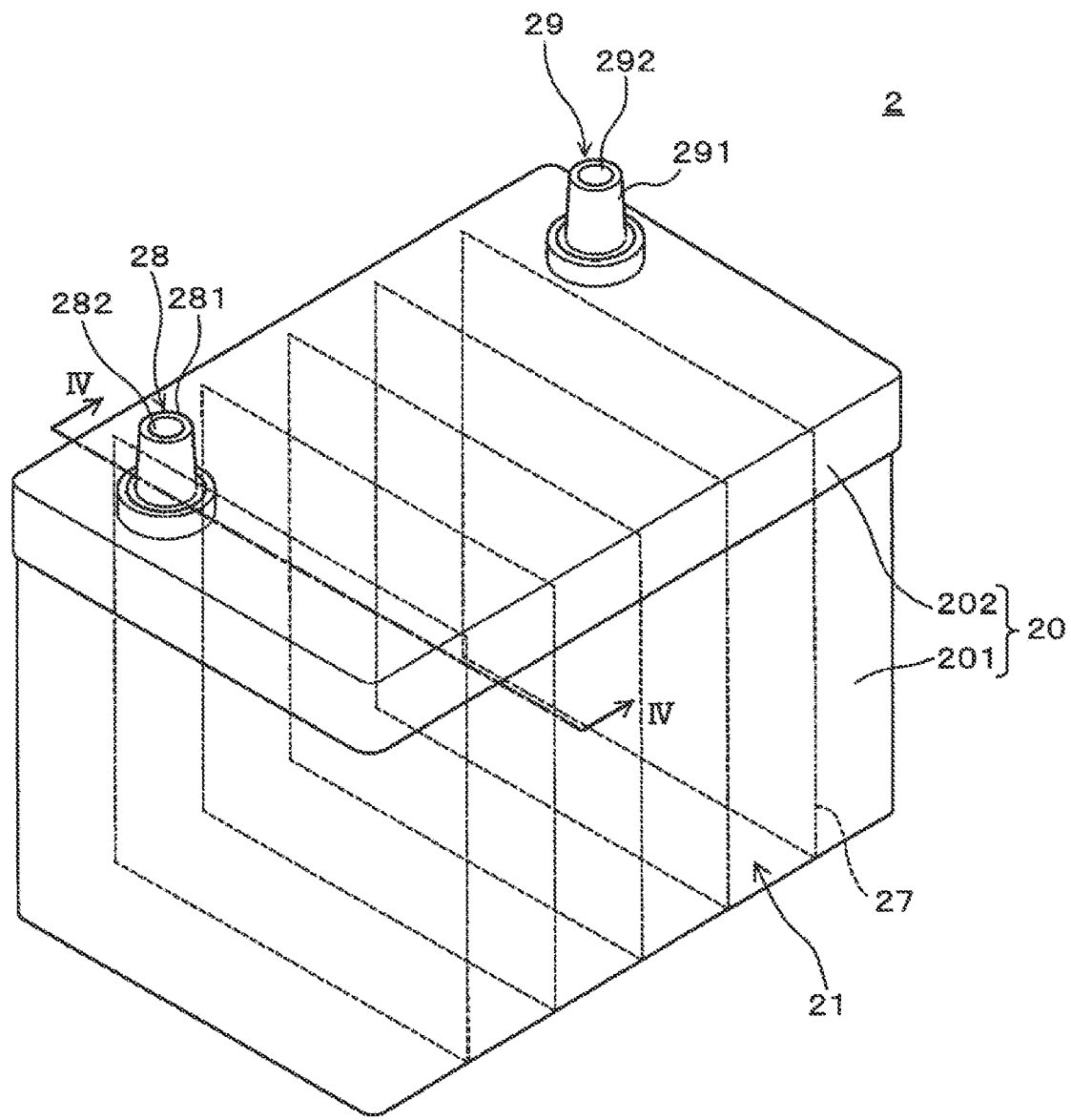
FIG. 3 is a perspective view illustrating an external appearance configuration of a battery.
Figure 4:
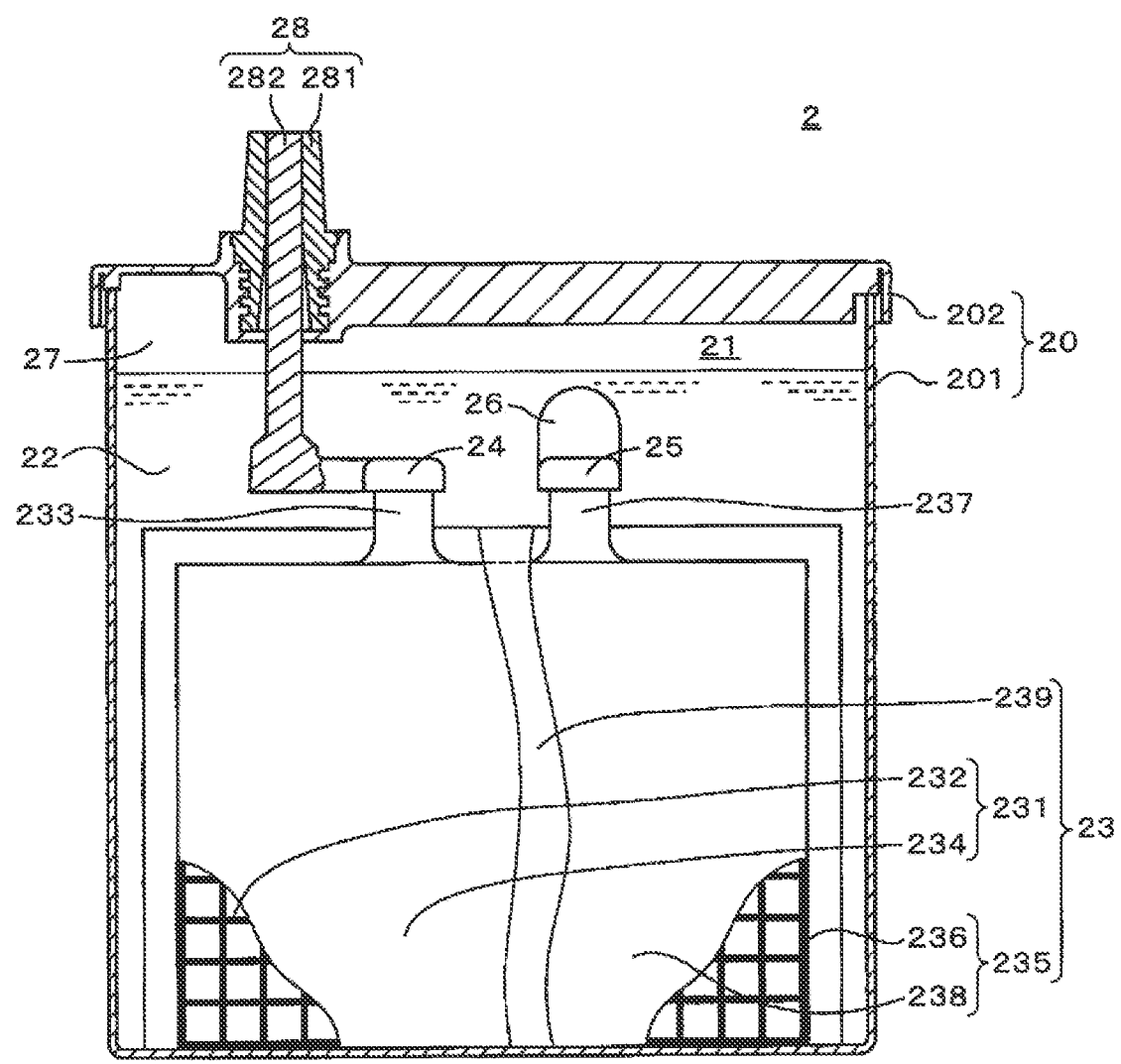
FIG. 4 is a cross-sectional view of the battery in FIG. 3 taken along line IV-IV.

FIG. 3 is a perspective view illustrating an external appearance configuration of the battery 2 which is a liquid type battery for an automobile as an example, and FIG. 4 is a cross-sectional view of the battery 2 in FIG. 3 taken along line IV-IV.

As illustrated in FIG. 3 and FIG. 4, the battery 2 includes a container 20, a positive electrode terminal 28, a negative electrode terminal 29, and a plurality of elements 23.

The container 20 includes a container body 201 and a lid 202. The container body 201 is a rectangular parallelepiped container whose upper portion is opened. The container body 201 is made of, for example, a synthetic resin or the like. For example, the lid 202 made of a synthetic resin closes the opening portion of the container body 201. A peripheral edge portion of a lower surface of the lid 202 and a peripheral edge portion of the opening portion of the container body 201 are joined to each other by thermal welding, for example. A space in the container 20 is partitioned, by partition walls 27, into a plurality of cell chambers 21 arranged in a longitudinal direction of the container 20.

One element 23 is accommodated in each cell chamber 21 in the container 20. An electrolyte solution 22 that contains a dilute sulfuric acid is accommodated in each cell chamber 21 in the container 20, and the entire element 23 is immersed in the electrolyte solution 22. The electrolyte solution 22 is filled into the cell chamber 21 from an electrolyte solution filling port (not illustrated) formed in the lid 202.

The element 23 includes a plurality of positive electrode plates 231, a plurality of negative electrode plates 235, and separators 239. The plurality of positive electrode plates 231 and the plurality of negative electrode plates 235 are alternately arranged.

The positive electrode plate 231 includes: a positive electrode grid 232; and a positive electrode material 234 supported by the positive electrode grid 232. The positive electrode grid 232 is a conductive member having skeleton portions arranged substantially in a grid shape or in a mesh shape. The positive electrode grid 232 is made of, for example, lead or a lead alloy. The positive electrode grid 232 has an ear 233 that protrudes upward in the vicinity of an upper end of the positive electrode grid 232. The positive electrode material 234 contains a positive active material (lead dioxide or lead sulfate) that generates capacity by an oxidation-reduction reaction. The positive electrode material 234 may further contain a known additive.

The negative electrode plate 235 includes: a negative electrode grid 236; and a negative electrode material 238 supported by the negative electrode grid 236. The negative electrode grid 236 is a conductive member having skeleton portions arranged substantially in a grid shape or in a mesh shape. The negative electrode grid 236 is made of, for example, lead or a lead alloy. The negative electrode grid 236 has an ear 237 that protrudes upward in the vicinity of an upper end of the negative electrode grid 236. The negative electrode material 238 contains a negative active material (lead or lead sulfate) that generates capacity by an oxidation-reduction reaction. The negative electrode material 238 may further contain a known additive.

The separator 239 is made of, for example, an insulating material such as glass or a synthetic resin. The separator 239 is interposed between the positive electrode plate 231 and the negative electrode plate 235 disposed adjacently to each other. The separators 239 may be formed as an integral member or each of the separators 239 may be interposed between the positive electrode plate 231 and the negative electrode plate 235 disposed adjacently to each other. The separator 239 may be disposed so as to wrap either the positive electrode plates 231 or the negative electrode plates 235.

The ears 233 of the plurality of positive electrode plates 231 are connected to a strap 24 made of, for example, lead or a lead alloy. The plurality of positive electrode plates 231 are electrically connected to each other via the strap 24. Similarly, the ears 237 of the plurality of negative electrode plates 235 are connected to a strap 25 made of, for example, lead or a lead alloy. The plurality of negative electrode plates 235 are electrically connected to each other via the strap 25.

In the battery 2, the strap 25 in one cell chamber 21 is connected to the strap 24 in another cell chamber 21 disposed adjacently to one cell chamber 21 via an intermediate pole 26. The intermediate pole 26 is made of, for example, lead or a lead alloy. In the battery 2, the strap 24 in one cell chamber 21 is connected to the strap 25 in another cell chamber 21 disposed adjacently to one cell chamber 21 via the intermediate pole 26. That is, the plurality of elements 23 of the battery 2 are electrically connected to each other in series via the straps 24, 25 and the intermediate poles 26. As illustrated in FIG. 4, the strap 24 accommodated in the cell chamber 21 located at one end in the direction that cells C are arranged is connected not to the intermediate pole 26 but to a positive pole 282 described later. The strap 25 accommodated in the cell chamber 21 located at the other end in the direction that the cells C are arranged is connected not to the intermediate pole 26 but to a negative pole 292 (not illustrated).

The positive electrode terminal 28 is disposed at one end portion in the direction that the cells C are arranged, and the negative electrode terminal 29 is disposed in the vicinity of the other end portion in the direction that the cells C are arranged.

As illustrated in FIG. 4, the positive electrode terminal 28 includes a bushing 281 and the positive pole 282. The bushing 281 is a substantially cylindrical conductive member, and is made of, for example, a lead alloy. A lower portion of the bushing 281 is integrally formed with the lid 202 by insert molding, and an upper portion of the bushing 281 protrudes upward from an upper surface of the lid 202. The positive pole 282 is a substantially columnar conductive member. The positive pole 282 is made of a lead alloy, for example. The positive pole 282 is inserted into a hole formed in the bushing 281. An upper end portion of the positive pole 282 is located at substantially the same position as an upper end portion of the bushing 281, and is joined to the bushing 281 by welding, for example. A lower end portion of the positive pole 282 protrudes downward from a lower end portion of the bushing 281, and further protrudes downward from a lower surface of the lid 202. The lower end portion of the positive pole 282 is connected to the strap 24 accommodated in the cell chamber 21 located at one end portion in the direction that the cells C are arranged.

The negative electrode terminal 29 has substantially the same configuration as the positive electrode terminal 28. The negative electrode terminal 29 includes a bushing 291 and a negative pole 292 (see FIG. 3).

In discharging the battery 2, a load (not illustrated) is connected to the bushing 281 of the positive electrode terminal 28 and the bushing 291 of the negative electrode terminal 29. Electricity generated by a reaction in the positive electrode plates 231 of each element 23 (a reaction in which lead sulfate is generated from lead dioxide) and a reaction in the negative electrode plates 235 of each element 23 (a reaction in which lead sulfate is generated from lead (spongy lead)) is supplied to the load. In charging the battery 2, a power source (not illustrated) is connected to the bushing 281 of the positive electrode terminal 28 and the bushing 291 of the negative electrode terminal 29. Accordingly, with the supply of electricity from the power source, a reaction in the positive electrode plates 231 of each element 23 (a reaction in which lead dioxide is generated from lead sulfate) and a reaction in the negative electrode plates 235 of each element 23 (a reaction in which lead (spongy lead) is generated from lead sulfate) are generated so that the battery 2 is charged with electricity.

FIG. 5 is an explanatory view illustrating one example of a record layout of a degree-of-deterioration DB 34.

The degree-of-deterioration DB 34 stores: a number column; history columns such as a lifetime effective discharge capacity column, a lifetime effective charge capacity column, a lifetime effective overcharge capacity column, a temperature cumulative value column, a standing time column, and a state-of-charge (SOC) stay time column; a design information column such as a positive electrode grid thickness column; a diagnosis information column; physical quantity columns such as a first physical quantity column, a second physical quantity column, a third physical quantity column, a fourth physical quantity column, a fifth physical quantity column, a sixth physical quantity column, a seventh physical quantity column, an eighth physical quantity column, and a ninth physical quantity column; and a degree-of-deterioration column.

The number column stores the numbers of the degrees of deteriorations of a plurality of different batteries 2, and the numbers of the degrees of deteriorations of the same battery 2 at different timings. The lifetime effective discharge capacity column stores, for example, a cumulative value of effective discharge capacity obtained by measuring discharge capacity of the battery 2 for every 1 minute and by multiplying the measured discharge capacities by coefficients based on the temperatures of the battery 2 at the respective points of time. The lifetime effective charge capacity column stores, for example, a cumulative value of effective charge capacity obtained by measuring charge capacity of the battery 2 for every 1 minute and by multiplying the measured charge capacities by coefficients based on the temperatures of the battery 2 at the respective points of time. The lifetime effective overcharge capacity column stores a cumulative value of the effective overcharge capacities obtained by subtracting the effective discharge capacities from the effective charge capacities.

The temperature cumulative value column stores, for example, a cumulative value obtained by cumulating values each obtained by multiplying a center temperature in each temperature interval by predetermined coefficients and time at a temperature interval of every 10° C. from −20° C. to 80° C.

The standing time stores a cumulated value of parking times.

The SOC stay time column stores a stay time with an SOC of 0 to 20%, a stay time with an SOC of 20 to 40%, a stay time with an SOC of 40 to 60%, a stay time with an SOC of 60 to 80%, a stay time with an SOC of 80 to 100% and the like. With respect to the stay time with an SOC of 0 to 20%, for example, the degree-of-deterioration DB 34 obtains an average SOC at a unit time of 1 hours, and stores a cumulative value of times during which the average SOC falls within a range of 0 to 20%. Similarly, with respect to the stay time with an SOC of 20 to 40%, the stay time with an SOC of 40 to 60%, the stay time with an SOC of 60 to 80%, and the stay time with an SOC of 80 to 100%, the degree-of-deterioration DB 34 stores: a cumulative value of times during which the average SOC falls within a range of 20 to 40%, a cumulative value of times during which the average SOC falls within a range of 40 to 60%; a cumulative value of times during which the average SOC falls within a range of 60 to 80%; and a cumulative value of times during which the average SOC falls within a range of 80 to 100%.

The positive electrode grid thickness column stores a thickness of the positive electrode grid.

The diagnosis information column stores diagnosis information such as internal resistances, SOCs, OCVs and the like.

The first physical quantity column stores amounts of positive active material. In FIG. 5, the first physical quantity is expressed in six grades of evaluation from 0 to 5. The evaluation is set such that the evaluation "0" means that a decrease rate of an amount of a positive active material is 0%, the decrease rate is increased as the number is increased, and the decrease rate is 40% or more when the evaluation is "5".

The second physical quantity column stores specific surface areas of positive electrode materials. The second physical quantity is expressed in six grades of evaluation. Similarly, as described above, the evaluation is set such that the evaluation "0" means that a decrease rate of specific surface area of a positive electrode material is 0%, the decrease rate is increased as the number is increased, and the decrease rate is 80% or more when the evaluation is "5".

The third physical quantity column stores bulk densities of positive electrode materials. The third physical quantity is expressed in six grades of evaluation. Similarly, as described above, the evaluation is set such that the evaluation "0" means that a decrease rate of bulk density of a positive electrode material is 0%, the decrease rate is increased as the number is increased, and the decrease rate is 40% or more when the evaluation is "5".

The fourth physical quantity column stores cluster sizes of positive active material particles. The fourth physical quantity is expressed in six grades of evaluation. The evaluation is set such that the evaluation "0" means that a decrease rate of a cluster size of a positive active material particles is 0%, the decrease rate is increased as the number is increased, and the decrease rate is 99.0% or more when the evaluation is "5".

The fifth physical quantity column stores cumulative amounts of lead sulfate in a negative electrode materials. The fifth physical quantity is expressed in six grades of evaluation. The evaluation is set such that the evaluation "0" means that a cumulative amount of lead sulfate in a negative electrode is 0%, the cumulative amount is increased as the number is increased, and the cumulative amount is 60% or more when the evaluation is "5".

The sixth physical quantity column stores specific surface areas of negative electrode materials. The sixth physical quantity is expressed in six grades of evaluation. The evaluation is set such that the evaluation "0" means that a decrease rate of the specific surface areas of negative electrode materials is 0%, the decrease rate is increased as the number is increased, and the decrease rate is 50% or more when the evaluation is "5".

The seventh physical quantity column stores corrosion amounts of the positive electrode grids. The seventh physical quantity is expressed by indicating a decrease amount of metal Pb (or a Pb alloy) caused by corrosion in six grades of evaluation. The evaluation is set such that the evaluation "0" means that the decrease amount of metal Pb (or a Pb alloy) is 0%, the decrease amount is increased as the number is increased, and the decrease amount is 40% or more when the evaluation is "5".

The eighth physical quantity column stores resistivity of the positive electrode plate. The eighth physical quantity is expressed in six grades of evaluation. The evaluation is set such that the evaluation "0" means that resistivity of the positive electrode plate is 0%, the rate of resistivity is increased as the number is increased, and the rate of resistivity is 100% or more when the evaluation is "5".

The ninth physical quantity column stores resistivity of the negative electrode plate. The eighth physical quantity is expressed in six grades of evaluation. The evaluation is set such that the evaluation "0" means that resistivity of the positive electrode plate is 0%, the rate of resistivity is increased as the number is increased, and the rate of resistivity is 100% or more when the evaluation is "5".

The evaluation of the first physical quantity, the second physical quantity, the third physical quantity, the fourth physical quantity, the fifth physical quantity, the sixth physical quantity, the seventh physical quantity, the eighth physical quantity, and the ninth physical quantity is not limited to six grades. The evaluation may be made in one hundred grades or may be made in accordance with numerical values of the physical quantities.

The degree-of-deterioration column stores the degrees of deterioration expressed by the evaluation in ten grades. The numerical values of 1 to 10 expressing the degree of deterioration are determined based on, for example, a range of state of health (SOH). In determining the following rates as the SOH, the numerical value "1" expresses that the SOH falls within a range of 90 to 100%, and "10" expresses that the SOH falls within a range of 0 to 10%. The SOH can be determined based on a characteristic that the battery 2 is expected to possess. For example, using a usable period during which the battery 2 can be used as a reference, a rate of the remaining usable period at the time of performing evaluation may be also determined as the SOH. Using a voltage during normal-temperature high-rate discharging as a reference, a voltage during the normal-temperature high-rate discharging at the time of performing evaluation may be used for the evaluation of the SOH. In any case, when the SOH is 10, such a case indicates a state where functions of the battery 2 are lost.

Information stored in the degree-of-deterioration DB 34 may not be limited to the above-mentioned information.

The degree-of-deterioration DB 34 may store, as design information, besides a thickness of the positive electrode grid, at least one selected from the group consisting of the number of the positive electrode plates and the number of the negative electrode plates, an amount of the positive active material, a mass of the positive electrode grid, a design of the positive electrode grid, density of the positive electrode material, composition of the positive electrode material, an amount and a kind of an additive in the positive electrode material, composition of a positive electrode alloy, a presence or non-presence, a thickness, a material and gas permeability of a non-woven fabric that is brought into contact with the positive electrode plate, an amount of the negative active material, an amount and a kind of carbon in the negative electrode material, an amount and a kind of an additive in the negative electrode material, a specific surface area of the negative electrode material, a kind and concentration of an additive in an electrolyte solution, and a specific gravity of the electrolyte solution.

When an internal resistance and an OCV are stored as the diagnosis information, the internal resistance and the OCV depend on the SOC. Accordingly, the internal resistance and the OCV may be corrected by a separately obtained SOC.

FIG. 6 is an explanatory view illustrating one example of a record layout of the above-mentioned use history DB 35.

The use history DB 35 stores histories, design information, diagnosis information, physical quantities, and the degrees of deterioration at respective points of time of estimation for respective batteries 2. FIG. 6 illustrates a use history of the battery 2 having an identification number (ID No. 1). The use history DB 35 stores: a number column; derivation history columns such as a lifetime effective discharge capacity column, a lifetime effective charge capacity column, a lifetime effective overcharge capacity column, a temperature cumulative value column, a standing time, and an SOC stay time column; a design information column such as a positive electrode grid thickness column; a diagnosis information column; physical quantity columns such as a first physical quantity column, a second physical quantity column, a third physical quantity column, a fourth physical quantity column, a fifth physical quantity column, a sixth physical quantity column, a seventh physical quantity column, an eighth physical quantity column, and a ninth physical quantity column; and a degree-of-deterioration column. The number column stores the number at each estimation point of time. The derivation history column, the design information column, and the diagnosis information column of the use history DB 35 store substantially the same contents as the history columns, the design information column, and the diagnosis information column of the degree-of-deterioration DB 34.

The first physical quantity column, the second physical quantity column, the third physical quantity column, the fourth physical quantity column, the fifth physical quantity column, the sixth physical quantity column, the seventh physical quantity column, the eighth physical quantity column, and the ninth physical quantity column store a first physical quantity, a second physical quantity, a third physical quantity, a fourth physical quantity, a fifth physical quantity, a sixth physical quantity, a seventh physical quantity, an eighth physical quantity, and a ninth physical quantity that are specified based on a derivation history at each estimation point of time as described later.

The degree-of-deterioration column stores the degree of deterioration estimated based on at least one or more of the first physical quantity, the second physical quantity, the third physical quantity, the fourth physical quantity, the fifth physical quantity, the sixth physical quantity, the seventh physical quantity, the eighth physical quantity, and the ninth physical quantity that are specified as above.

Information stored in the use history DB 35 is not limited to the above-mentioned case.

Hereinafter, an estimation method for estimating the degree of deterioration will be described.

Figure 7:
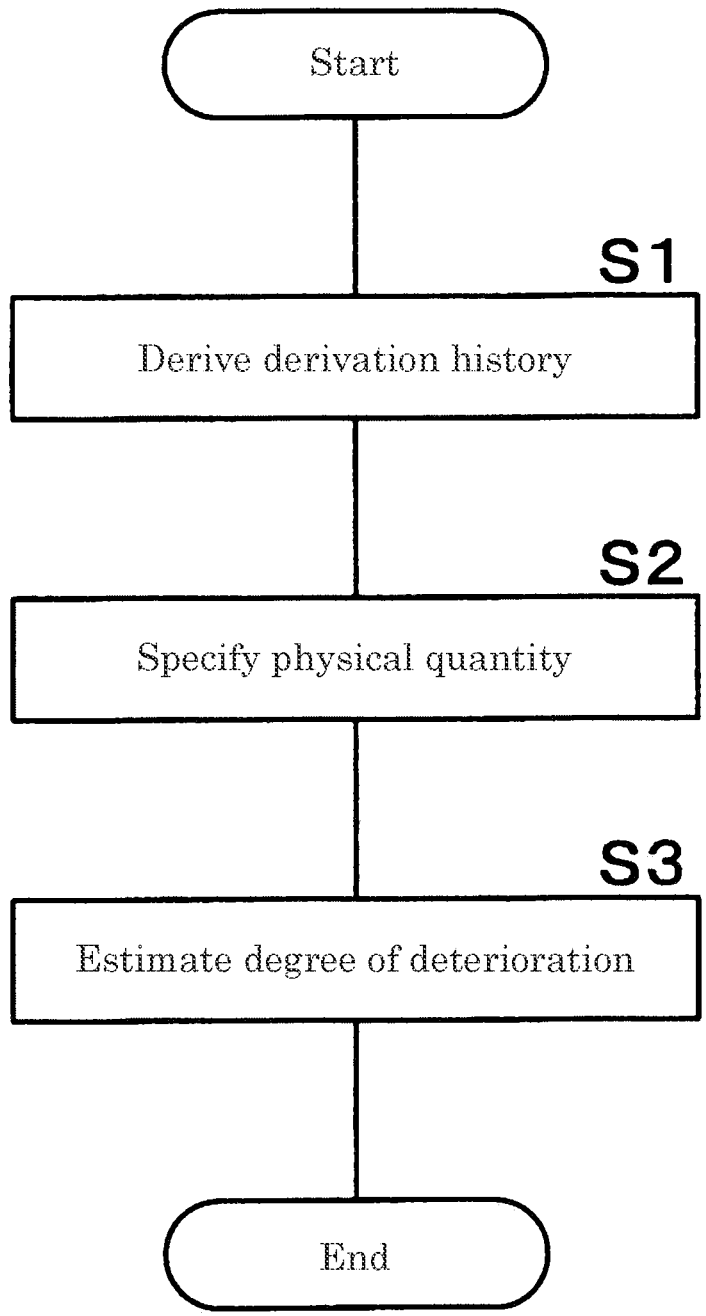
FIG. 7 is a flowchart illustrating steps of processing for estimating the degree of deterioration performed by a control unit.

FIG. 7 is a flowchart illustrating steps of estimation processing for estimating the degree of deterioration performed by a control unit 31. The control unit 31 performs the following processing at predetermined points of time of estimation.

With respect to the battery 2 having the identification number No. 1, the control unit 31 derives use histories (derivation histories) such as a lifetime effective discharge capacity based on a voltage, a current, and a temperature acquired at a point of time of estimation, and stores the use histories in the use history DB 35 (S1).

The control unit 31 reads the degree-of-deterioration DB 34, specifies the first physical quantity based on the first relationship between the first history and the first physical quantity and the derivation history that are derived from the data of the degree-of-deterioration DB 34, and stores the first physical quantity in the use history DB 35 (S2). Similarly, the control unit 31 specifies the second physical quantity based on the second relationship between the second history and the second physical quantity and the derivation history that are derived from the data of the degree-of-deterioration DB 34, specifies the third physical quantity based on the third relationship between the third history and the third physical quantity and the derivation history that are derived from the data of the degree-of-deterioration DB 34, specifies the fourth physical quantity based on the fourth relationship between the fourth history and the fourth physical quantity and the derivation history that are derived from the data of the degree-of-deterioration DB 34. Then, the control unit 31 stores the second to the fourth physical quantities in the use history DB 35. Similarly, the control unit 31 specifies the fifth physical quantity based on the fifth relationship between the fifth history and the fifth physical quantity and the derivation history, specifies the sixth physical quantity based on the sixth relationship between the sixth history and the sixth physical quantity and the derivation history, specifies the seventh physical quantity based on the seventh relationship between the seventh history and the seventh physical quantity and the derivation history, specifies the eighth physical quantity based on the eighth relationship between the eighth history and the eighth physical quantity and the derivation history, specifies the ninth physical quantity based on the ninth relationship between the ninth history and the ninth physical quantity and the derivation history.

Then, the control unit 31 stores the fifth to the ninth physical quantities in the use history DB 35. The first history, the second history, the third history, the fourth history, the fifth history, the sixth history, the seventh history, the eighth history, and the ninth history may be the same or different from each other. For example, in the case of the first history, the first history includes the histories of a lifetime effective discharge capacity, a temperature cumulative value, and a use period and the like. The control unit 31 specifies at least one or more of the first physical quantity, the second physical quantity, the third physical quantity, the fourth physical quantity, the fifth physical quantity, the sixth physical quantity, the seventh physical quantity, the eighth physical quantity, and the ninth physical quantity.

The control unit 31 estimates the degree of deterioration from the physical quantity specified based on the relationship between at least one or more of the first physical quantity, the second physical quantity, the third physical quantity, the fourth physical quantity, the fifth physical quantity, the sixth physical quantity, the seventh physical quantity, the eighth physical quantity, and the ninth physical quantity, and the degree of deterioration that are derived from the data of the degree-of-deterioration DB 34, and stores the specified degree of deterioration in the use history DB 35 (S3), and finishes the processing.

When design information is also stored in the degree-of-deterioration DB 34, in step S2, the control unit 31 also specifies the first physical quantity based on the first relationship between the first history, the design information, and the first physical quantity, and the derivation history. The first physical quantity may be corrected by the design information. Similarly, the second physical quantity to the ninth physical quantity are also specified based on the relationship between the second history to the ninth history, the design information, and the second physical quantity to the ninth physical quantity and the derivation history.

When diagnosis information is also stored in the degree-of-deterioration DB 34, the degree of deterioration may be corrected by the diagnosis information in step S3.

The degree-of-deterioration DB 34 may store functions of the first relationship, the second relationship, the third relationship, the fourth relationship, the fifth relationship, the sixth relationship, the seventh relationship, the eighth relationship, and the ninth relationship.

The control unit 31 may erase and reset data in the use history DB 35 when the control unit 31 determines that the battery 2 has been exchanged based on the estimated degree of deterioration or the diagnosis information and a preset threshold value. The control unit 31 may perform an operation other than resetting the data in the use history DB 35 when the control unit 31 determines that the battery 2 has been exchanged. That is, the control unit 31 may set, when the control unit 31 determines that the battery 2 has been exchanged, a point of time of starting cumulation of the history information stored in the use history DB 35 when the control unit 31 determines that the battery 2 has been exchanged as the point of time at which the battery 2 has been exchanged.

According to the embodiment, the histories are derived based on a current, a voltage and a temperature. One or more physical quantities are specified based on the relationships between the derived histories and the physical quantities preliminarily obtained, and the degree of deterioration of the deterioration factor is specified. The degree of deterioration of the battery 2 is satisfactorily estimated based on the degrees of deterioration of the deterioration factors.

Embodiment 2

Figure 8:
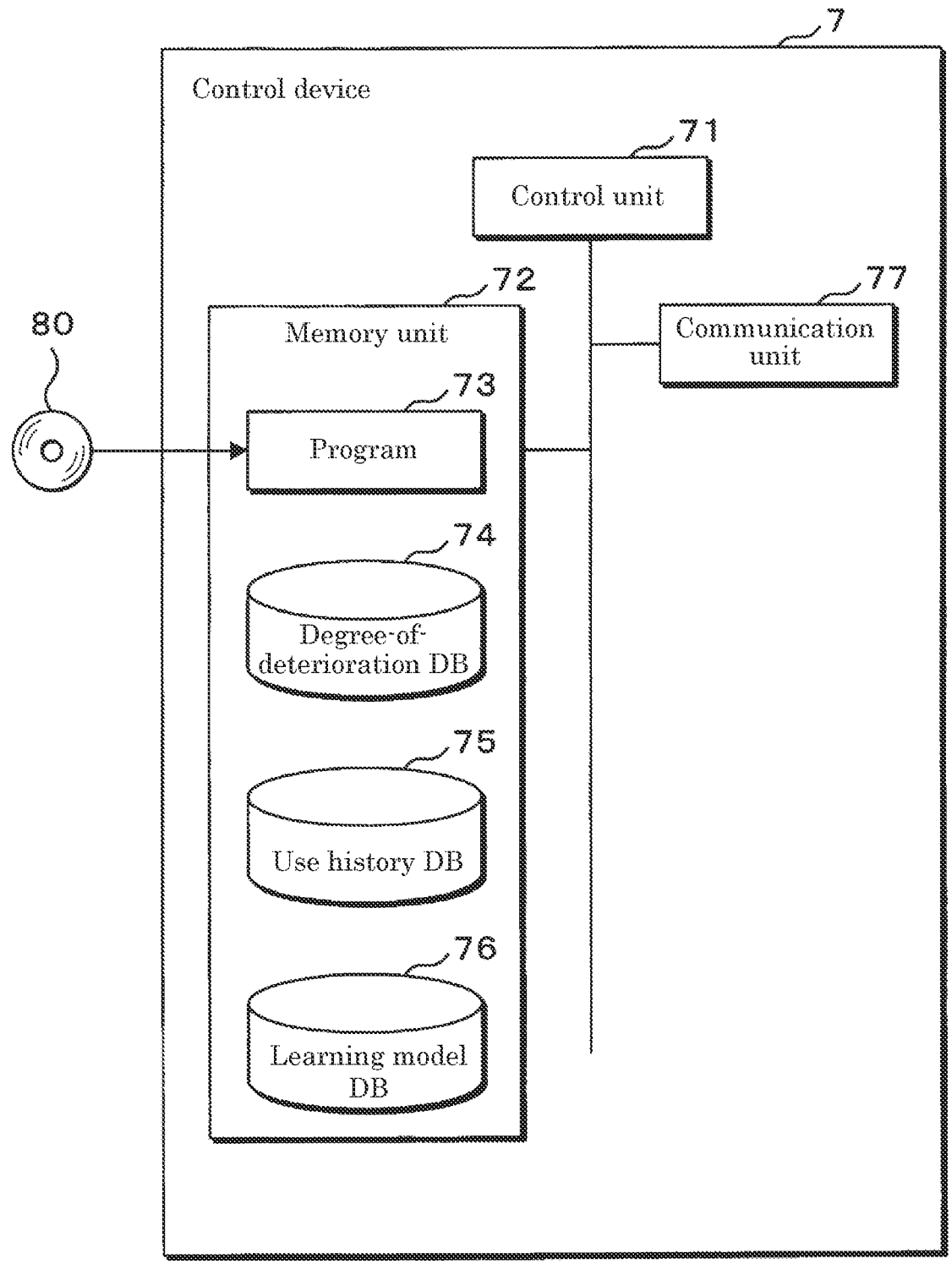
FIG. 8 is a block diagram illustrating the configuration of a control device according to an embodiment 2.

FIG. 8 is a block diagram illustrating the configuration of a control device 7 according to an embodiment 2.

A charge-discharge system 1 according to the embodiment 2 has substantially the same configuration as the charge-discharge system 1 according to the embodiment 1 except that the control device 7 stores a program 73 for estimation of deterioration, a degree-of-deterioration DB 74, a use history DB 75, and a learning model DB 76 in a memory unit 72.

The learning model DB 76 stores a first learning model and a second learning model described later.

The degree-of-deterioration DB 74 has the same configuration as the degree-of-deterioration DB 34.

FIG. 9 is an explanatory view illustrating one example of a record layout of a use history DB 75.

The use history DB 75 stores histories, design information, diagnosis information, physical quantities, actually measured physical quantities, the degrees of deterioration, and the degrees of deterioration based on the actual measurement at respective points of time of estimation for respective batteries 2. FIG. 9 illustrates use histories of the batteries 2 each having an identification number No. 1 (ID No. 1). The use history DB 75 stores: a number column; history columns such as a lifetime effective discharge capacity column, a lifetime effective charge capacity column, a lifetime effective overcharge capacity column, a temperature cumulative value column, a standing time, and a state-of-charge (SOC) stay time column, a design information column such as a positive electrode grid thickness, a diagnosis information column, physical quantity columns such as a first physical quantity column, a second physical quantity column, a third physical quantity column, a fourth physical quantity column, a fifth physical quantity column, a sixth physical quantity column, a seventh physical quantity column, an eighth physical quantity column, and a ninth physical quantity column, an actually measured first physical quantity column, an actually measured second physical quantity column, an actually measured third physical quantity column, an actually measured fourth physical quantity column, an actually measured fifth physical quantity column, an actually measured sixth physical quantity column, an actually measured seventh physical quantity column, an actually measured eighth physical quantity column, an actually measured ninth physical quantity column, a degree-of-deterioration column, and an actually-measured degree-of-deterioration column. The number column stores the number at each estimation point of time. The histories, the design information and the diagnosis information of the use history DB store the substantially the same contents as the histories, the diagnosis information and the design information of the degree-of-deterioration DB 34.

The first physical quantity column, the second physical quantity column, the third physical quantity column, the fourth physical quantity column, the fifth physical quantity column, the sixth physical quantity column, the seventh physical quantity column, the eighth physical quantity column, and the ninth physical quantity column store a first physical quantity, a second physical quantity, a third physical quantity, a fourth physical quantity, a fifth physical quantity, a sixth physical quantity, a seventh physical quantity, an eighth physical quantity, and a ninth physical quantity that are specified by inputting the use history at each estimation point of time to the first learning model as described later.

The degree of deterioration column stores the degree of deterioration estimated by inputting one or more of the first physical quantity, the second physical quantity, the third physical quantity, the fourth physical quantity, the fifth physical quantity, the sixth physical quantity, the seventh physical quantity, the eighth physical quantity, and the ninth physical quantity that are specified as above to the second learning model.

The actually-measured first physical quantity column, the actually-measured second physical quantity column, the actually-measured third physical quantity column, the actually-measured fourth physical quantity column, the actually-measured fifth physical quantity column, the actually-measured sixth physical quantity column, the actually-measured seventh physical quantity column respectively store the actually-measured eighth physical quantity column, and the actually-measured ninth physical quantity column store a first physical quantity, a second physical quantity, a third physical quantity, a fourth physical quantity, a fifth physical quantity, a sixth physical quantity, a seventh physical quantity, an eighth physical quantity, and a ninth physical quantity that are obtained by actual measurement respectively.

The actually-measured degree-of-deterioration column obtains a state of health (SOH) by actual measurement, and stores the determined degrees of deterioration.

The physical quantities by actual measurement and the degrees of deterioration by actual measurement are obtained to be used in relearning that is described later. It is unnecessary to obtain the actually-measured physical quantity and the actually-measured degree of deterioration at all points of time of estimation.

Figure 10:
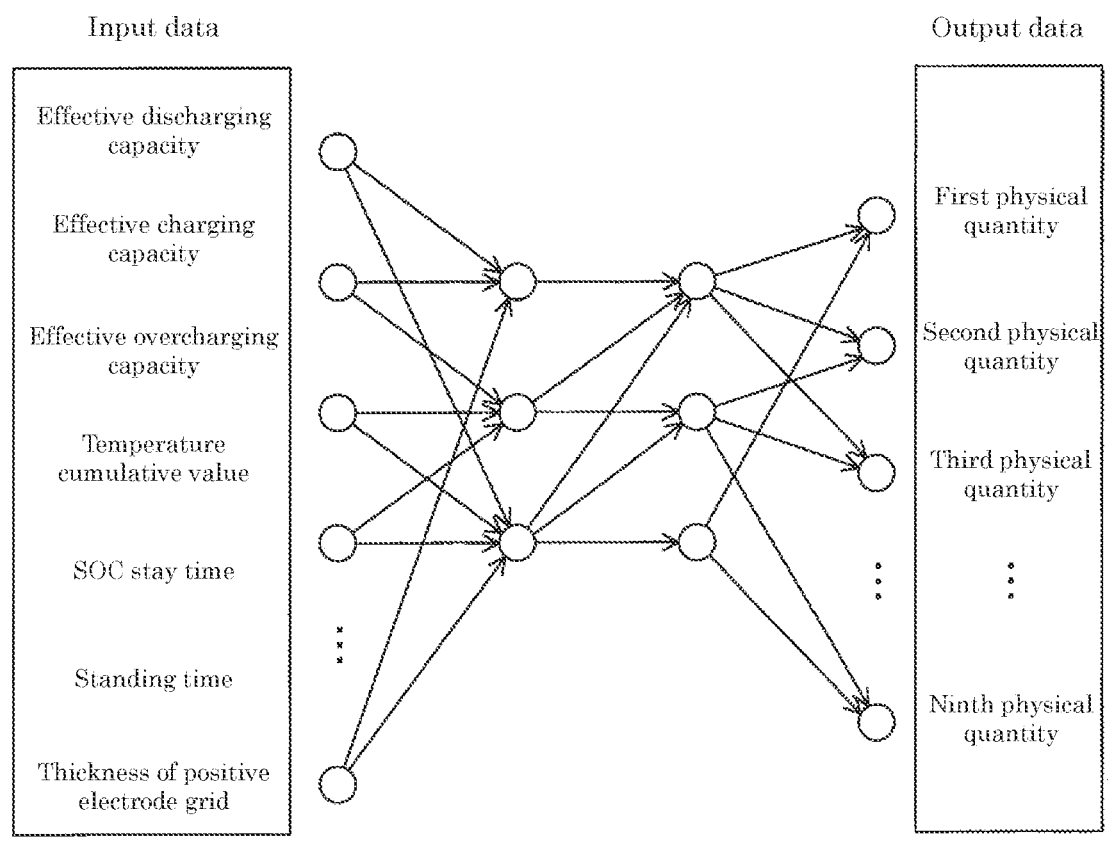
FIG. 10 is a schematic view illustrating one example of a first learning model.

FIG. 10 is a schematic view illustrating one example of the first learning model.

The first learning model is a learning model expected to be used as a program module that is a part of artificial intelligence software. The first learning model can use a multilayer neural network (deep learning). For example, the first learning model can use a convolutional neural network (CNN). The first learning model may also use a recurrent neural network (RNN). Other machine learnings such as decision trees, random forests, support vector machines, and the like may also be used. The control unit 71 is configured to perform an operation in such a manner that the control unit 71 applies an arithmetic operation to the derivation history information inputted to an input layer of the first learning model in accordance with a command from the first learning model, and outputs the first physical quantity, the second physical quantity, the third physical quantity, the fourth physical quantity, the fifth physical quantity, the sixth physical quantity, the seventh physical quantity, the eighth physical quantity, the ninth physical quantity, and the probabilities of these physical quantities. Two intermediate layers are illustrated in FIG. 10 for the sake of convenience. However, the number of intermediate layers is not limited to two, and may be three or more. In the case where the first learning model uses CNN, CNN includes a convolution layer and a pooling layer. The number of nodes (neurons) is also not limited to the number adopted in the case illustrated in FIG. 10.

One or a plurality of nodes exist in the input layer, the output layer and the intermediate layer. The nodes in each layer are coupled to the nodes existing in preceding and succeeding layers in one direction with desired weighting respectively. A vector having the same number of components as the number of nodes in the input layer is given as input data to the first learning model (input data for learning and input data for specifying the degrees of deterioration factors). The input data includes, as the derivation history information, a lifetime effective discharge capacity, a lifetime effective charge capacity, a lifetime effective overcharge capacity, a temperature cumulative value, a standing time, an SOC stay time, and the like. The input information is not limited to the above-mentioned information. The design information or the diagnosis information described previously may be inputted.

When the data given to each node in the input layer is inputted and given to the first intermediate layer, an output from the intermediate layer is calculated using weighting and an activation function. The calculated value is given to the next intermediate layer, and the calculated value is successively transmitted to subsequent layers (low-order layers) in the same manner until an output from the output layer is obtained. All weightings for coupling the nodes to each other are calculated by a learning algorithm.

The output layer of the first learning model generates, as output data, a first physical quantity, a second physical quantity, a third physical quantity, a fourth physical quantity, a fifth physical quantity, a sixth physical quantity, a seventh physical quantity, an eighth physical quantity, and a ninth physical quantity. The number of nodes in the output layer corresponds to the number of the physical quantities. For example, in a case where the first physical quantity is expressed by evaluation values of 0 to 5, the evaluation value of 0 to 5 and the probability corresponding to the respective evaluation values are outputted from the node of the first physical quantity. The embodiment is not limited to the case where the physical quantities are expressed by evaluations values in six grades. The physical quantity may be a numerical value. For example, the first physical quantity may be an amount of positive electrode active material.

The output layer outputs the evaluation values and the probabilities as follows, for example.

first physical quantity 0 . . . 0.08
1 . . . 0.78
. . .
5 . . . 0.01
. . .
ninth physical quantity 0 . . . 0.04
1 . . . 0.82
. . .
5 . . . 0.01

The control unit 71 acquires an evaluation value having probability equal to or greater than a predetermined value and the probability for each physical quantity. As a result, the physical quantity to be specified and the evaluation value are selected. Further, with respect to each physical quantity, an evaluation value having the maximum probability may be acquired.

In addition, the output layer may include a plurality of nodes that output combinations of the evaluation values of the first physical quantity, the second physical quantity, the third physical quantity, the fourth physical quantity, the fifth physical quantity, the sixth physical quantity, the seventh physical quantity, the eighth physical quantity, and the ninth physical quantity, and probabilities of the respective combinations. In a case where any one of the evaluation values from 0 to 5 and an "indefinite" physical quantity are to be associated with each other with respect to each physical quantity, when the "indefinite" physical quantity is included in the combination having the highest probability, the physical quantity is not specified.

Although the case has been described where the learning model 156 is CNN, RNN can be used as the first learning model as described previously. In the case where RNN is used as the first learning model, RNN is used by making the intermediate layer at a preceding point of time match with the input layer at a succeeding point of time.

Figure 11:
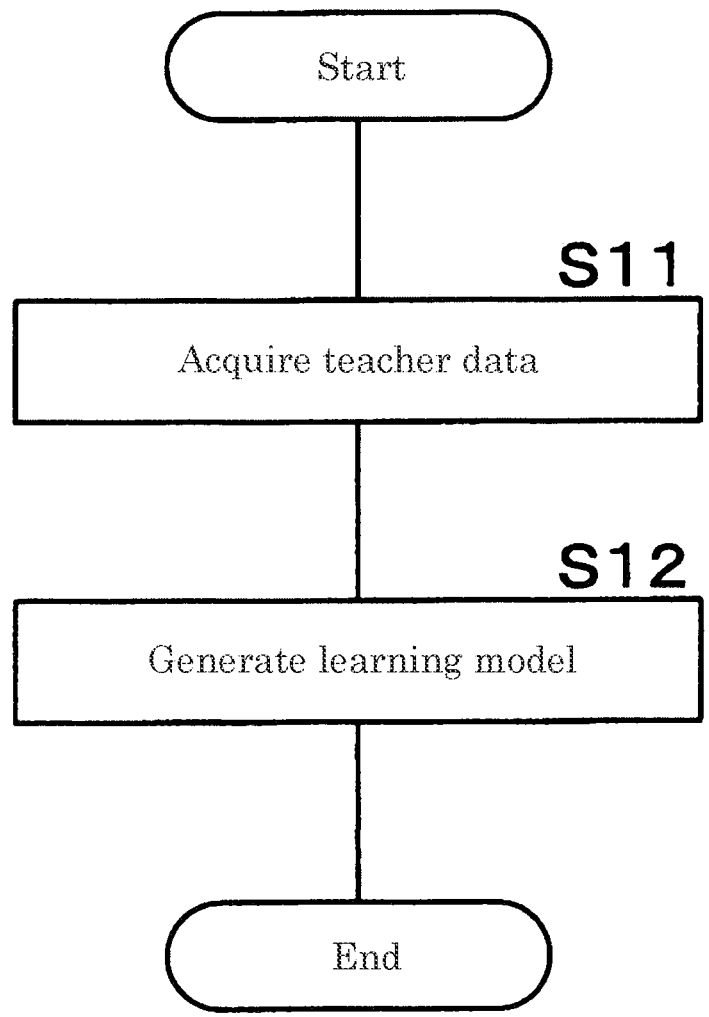
FIG. 11 is a flowchart illustrating steps of processing for generating the first learning model by a control unit.

FIG. 11 is a flowchart illustrating steps of processing for generating the first learning model by the control unit 71.

The control unit 71 reads the degree-of-deterioration DB 74, and acquires teacher data where the histories of each row are associated with the first physical quantity, the second physical quantity, the third physical quantity, the fourth physical quantity, the fifth physical quantity, the sixth physical quantity, the seventh physical quantity, the eighth physical quantity, and the ninth physical quantity of the each row (S11). The teacher data may be data where the histories and one physical quantity are associated with each other.

The control unit 71 generates a first learning model (learned model) that is configured to output a first physical quantity, a second physical quantity, a third physical quantity, a fourth physical quantity, a fifth physical quantity, a sixth physical quantity, a seventh physical quantity, an eighth physical quantity, and a ninth physical quantity when the histories are inputted to the first learning model (S12). Specifically, the control unit 71 inputs teacher data to the input layer, performs arithmetic processing in the intermediate layer, and acquires the combinations of the evaluation values of the respective physical quantities and the probabilities of the respective combinations from the output layer.

The control unit 71 compares the specified result of each physical quantity outputted from the output layer with information labeled to the history information in the teacher data, that is, a correct value. Then, the control unit 71 optimizes parameters used in the arithmetic processing performed in the intermediate layer so that an output value from the output layer approaches the correct value. The parameters are, for example, weighting (a coupling coefficient), a coefficient of an activation function and the like described above. A method of optimizing the parameters is not particularly limited. However, for example, the control unit 71 optimizes various parameters using an error back propagation method.

The control unit 71 generates a first learning model by performing the above-mentioned processing with respect to the history information of each teacher data contained in the degree-of-deterioration DB 74. The control unit 71 stores the generated first learning model in the memory unit 72, and finishes the series of processing.

Figure 12:
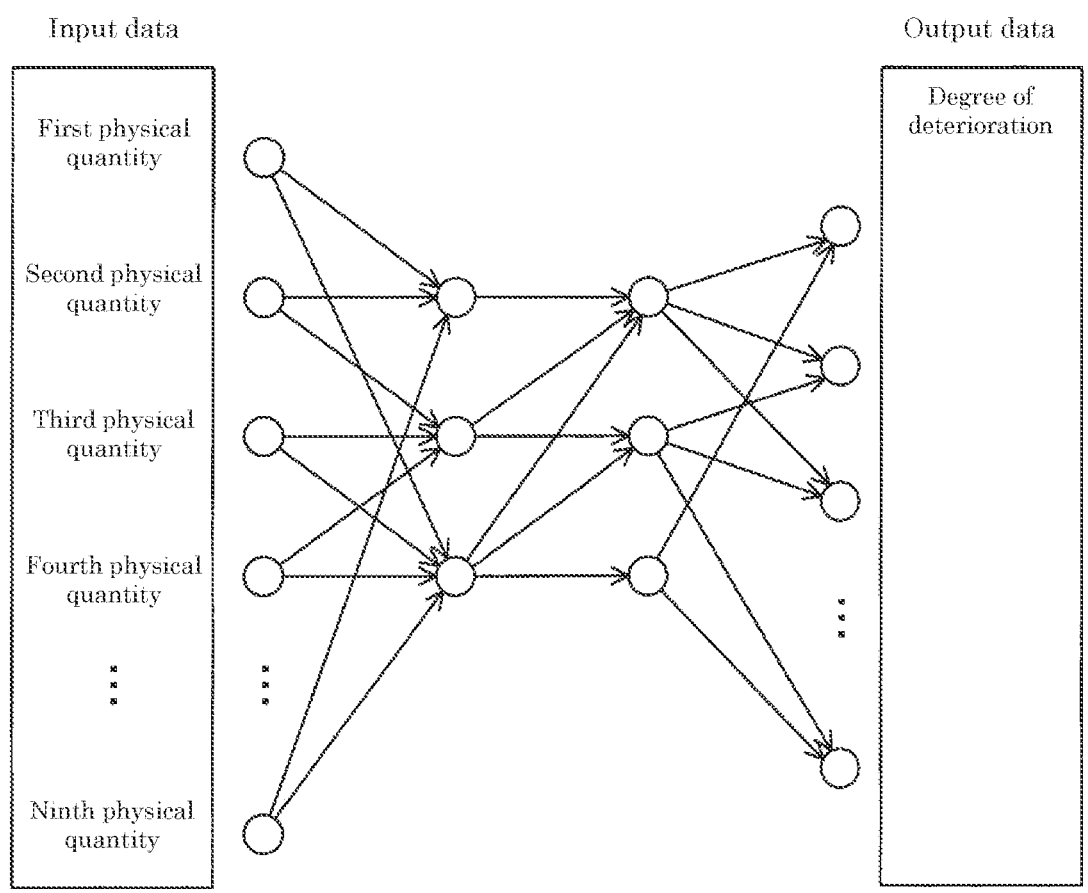
FIG. 12 is a schematic view illustrating one example of a second learning model.

FIG. 12 is a schematic view illustrating one example of a second learning model.

The second learning model is a learning model expected to be used as a program module that is a part of artificial intelligence software. For example, the second learning model can use a CNN. The second learning model may also use a RNN. In the case where RNN is used as the second learning model, a change in the degree of deterioration factor with time is inputted. Other machine learnings may be used. The control unit 71 is configured to perform, in accordance with a command from the learning model, an operation in such a manner that the control unit 71 applies an arithmetic operation to the first learning model, and outputs the first physical quantity, the second physical quantity, the third physical quantity, the fourth physical quantity, the fifth physical quantity, the sixth physical quantity, the seventh physical quantity, the eighth physical quantity and the ninth physical quantity inputted to an input layer of the second learning model, and outputs the degree of deterioration of the battery 2 and the probabilities of the degree of the deterioration of the battery 2. Two intermediate layers are illustrated in FIG. 12 for the sake of convenience. However, the number of intermediate layers is not limited to two, and may be three or more. The number of nodes is also not limited to the number adopted in the case illustrated in FIG. 12. Input data to the second learning model may include data inputted in the first learning model as input data.

The first physical quantity, the second physical quantity, the third physical quantity, the fourth physical quantity, the fifth physical quantity, the sixth physical quantity, the seventh physical quantity, the eighth physical quantity, and the ninth physical quantity are inputted to the input data. The input data includes at least one or more physical quantities.

An output layer of the second learning model generates a degree of deterioration as output data. The number of nodes in the output layer corresponds to the number of the degrees of deterioration. For example, when the degrees of deterioration are expressed by a numerical values from 1 to 10, the number of nodes can be set to 10. The output layer outputs the respective degrees of deterioration and probabilities of the respective degrees of deterioration. The degrees of deterioration are not limited to the case where the degree of deterioration is expressed as evaluation values in ten grades.

The output layer outputs, for example, the degrees of deterioration as follows.

degree of deterioration 1 . . . 0.01
degree of deterioration 2 . . . 0.07
degree of deterioration 3 . . . 0.88

The second learning model is generated in the same manner as the first learning model.

Figure 13:
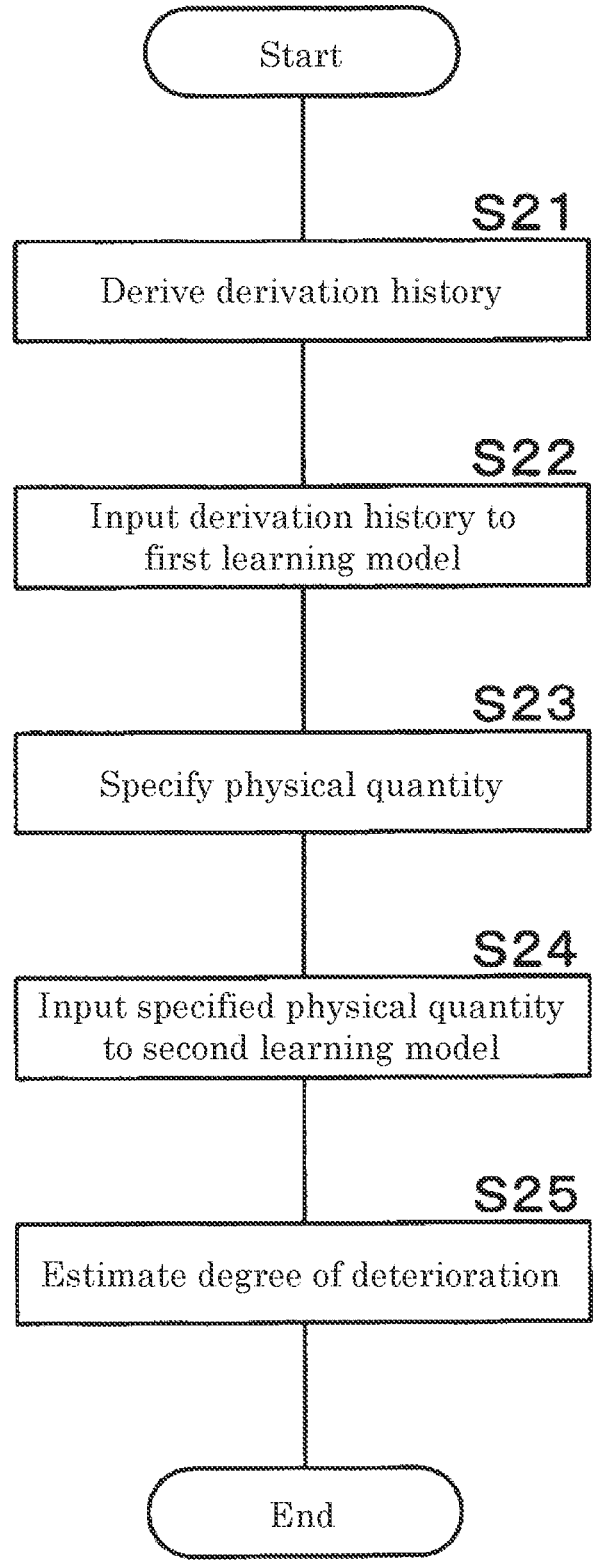
FIG. 13 is a flowchart illustrating steps of processing for estimating the degree of deterioration performed by the control unit.

FIG. 13 is a flowchart illustrating steps of estimation processing for estimating the degree of deterioration performed by the control unit 71.

With respect to the battery 2 having the identification number No. 1, the control unit 71 derives derivation history such as a lifetime effective discharge capacity at a point of time of estimation, and stores the derivation history in the use history DB 75 (S21). The control unit 71 may also store the design information and the diagnosis information.

The control unit 71 reads the learning model DB 76, and inputs the derivation history to the first learning model (S22).

The control unit 71 specifies, for example, a physical quantity the probability of the evaluation value of which is equal to or greater than a threshold value among the physical quantities outputted by the first learning model (S23).

The control unit 71 inputs the specified physical quantity to the second learning model (S24).

The control unit 71 acquires an expected value [Σ (degree of deterioration x probability)] based on the degree of deterioration that is outputted from the second learning model, estimates the total degree of deterioration (S25), and finishes the processing.

According to the present embodiment, the physical quantity can be easily and satisfactorily specified using the first learning model, and the deterioration of the battery 2 can be easily and satisfactorily estimated using the second learning model based on the specified physical quantity. In this embodiment, the description has been made with respect to the case where the first learning model outputs the first physical quantity, the second physical quantity, the third physical quantity, the fourth physical quantity, the fifth physical quantity, the sixth physical quantity, the seventh physical quantity, the eighth physical quantity, and the ninth physical quantity. However, the embodiment is not limited to such a case. One or more physical quantities may be specified by the first learning model, and the degrees of deterioration may be estimated using these specified physical quantities.

In addition, the estimation of the degrees of deterioration is not limited to the case where the estimation is performed using the second learning model. The degrees of deterioration may be estimated based on the relationship between the physical quantities and the degrees of deterioration derived from the degree-of-deterioration DB 74.

Then, the physical quantity may be specified based on the relationship between the history and the physical quantity derived from the degree-of-deterioration DB 74, and the specified physical quantity may be inputted to the second learning model so as to acquire the degree of deterioration.

The control unit 71 can cause the first learning model and the second learning model to relearn so that the reliability of the estimation of the degree of deterioration is improved based on the degree of deterioration estimated using the first learning model, the degree of deterioration estimated using the second learning model, and the degree of deterioration obtained by actual measurement. For example, with respect to the identification number No. 2 in the use history DB 35 illustrated in FIG. 9, the physical quantity estimated by the first learning model and the actually measured physical quantity agree with each other. Accordingly, it is possible to increase the probability of the physical quantity by causing the first learning mode to relearn by inputting a large number of teacher data where the physical quantity is associated with the derivation history of the identification number No. 2. Similarly, with respect to the identification number No. 2, the degree of deterioration estimated by the second learning model and the actually measured degree of deterioration agree with each other. Accordingly, it is possible to increase the probability of the degree of deterioration by causing the second learning mode to relearn by inputting a large number of teacher data where the degree of deterioration is associated with the physical quantity of the identification number No. 2. With respect to the identification number No. 3, the physical quantity does not agree with the actually measured physical quantity. Accordingly, the degree of deterioration does not agree with the actually measured degree of deterioration. Relearning is performed by inputting the teacher data where the actually measured physical quantity is associated with the derivation history.

The control unit 71 may erase and reset data in the use history DB 75 when the battery 2 is exchanged based on the estimated degree of deterioration or diagnosis information and a preset threshold value. Among the above-mentioned data, data on the rows that contain the actually measured degree of deterioration may be stored in the degree-of-deterioration DB 74. When the control unit 71 determines that the battery 2 has been exchanged, the control unit 71 may set a point of time of starting cumulation of the history information stored in the use history DB 75 as the point of time at which the battery 2 has been exchanged.

Embodiment 3

A charge-discharge system 1 according to an embodiment 3 has substantially the same configuration as the charge-discharge system 1 according to the embodiment 2 except for the following configuration. A learning model DB 76 receives inputting of derivation histories, and stores a learning model (1), a learning model (2), a learning model (3), a learning model (4), a learning model (5), a learning model (6), a learning model (7), a learning model (8), and a learning model (9) that output probabilities of the first physical quantity, the second physical quantity, the third physical quantity, the fourth physical quantity, the fifth physical quantity, the sixth physical quantity, the seventh physical quantity, the eighth physical quantity, and the ninth physical quantity respectively.

Figure 14:
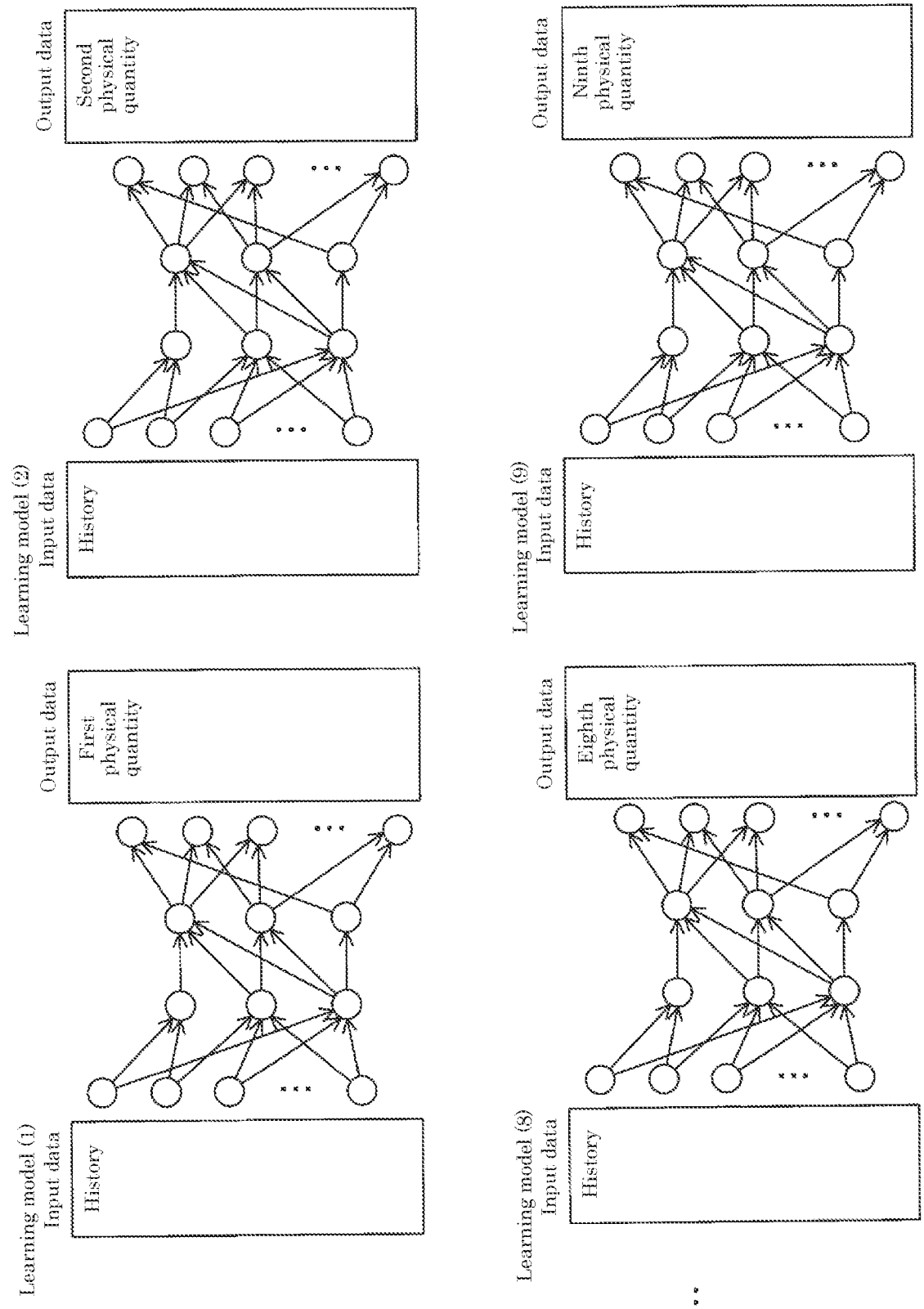
FIG. 14 is a schematic view illustrating one example of learning models (1) to (8).

FIG. 14 is a schematic view illustrating one example of the learning model (1), the learning model (2), . . . the learning model (8), and the learning model (9).

The learning model (1) is a learning model expected to be used as a program module that is a part of artificial intelligence software. For example, the learning model (1) can use a CNN. The learning model (1) may also use a RNN. Other machine learnings may be used. The control unit 71 is configured to perform an operation in such a manner that the control unit 71 applies an arithmetic operation to the use history inputted to an input layer of the learning model (1) in accordance with a command from the learning model (1), and outputs the first physical quantity and the probability of the physical quantity of the battery 2. Two intermediate layers are illustrated in FIG. 14 for the sake of convenience. However, the number of intermediate layers is not limited to two, and may be three or more. The number of nodes is also not limited to the number adopted in the case illustrated in FIG. 14.

Histories such as a lifetime effective discharge capacity, a temperature cumulative value, and a use period are inputted to the input layer of the learning model (1).

The output layer of the learning model (1) outputs the first physical quantities. The number of nodes in the output layer corresponds to the number of the first physical quantities. For example, when the first physical quantity is expressed by evaluation values from 0 to 5, the number of nodes can be set to 6. The output layer outputs the evaluation values of the first physical quantities and the probabilities of the respective evaluation values.

The output layer outputs the evaluation values and the probabilities as follows, for example.

first physical quantity 0 . . . 0.08
1 . . . 0.78
5 . . . 0.01

The control unit 71 reads the degree-of-deterioration DB 74, acquires teacher data where the first physical quantities are associated with histories, and generates the learning model (1) using the teacher data.

Histories such as a lifetime effective discharge capacity, a temperature cumulative value, and a use period are inputted to an input layer of the learning model (2).

The output layer of the learning model (2) outputs the second physical quantities. The number of nodes in the output layer corresponds to the number of the second physical quantities. For example, when the second physical quantity is expressed by numerical values from 0 to 5, the number of nodes can be set to 6. The output layer outputs the evaluation values of the second physical quantities and the probabilities of the respective evaluation values.

The control unit 71 reads the degree-of-deterioration DB 74, acquires teacher data where the second degrees are associated with histories, and generates the learning model B using the teacher data.

Similarly, histories such as a lifetime effective discharge capacity, a temperature cumulative value, and a use period are inputted to the input layer of the learning model (3) and the input layer of the learning model (4).

The output layers of the learning model (3) and the learning model (4) output the evaluation values of the third physical quantities and the fourth physical quantities, and the probabilities of the respective evaluation values.

Similarly, histories such as a lifetime effective discharge capacity, a lifetime effective charge capacity, a temperature cumulative value, a use period, a standing time, and a stay time in each SOC section are inputted to input layers of the learning model (5) and the learning model (6). The evaluation values of the fifth physical quantities and the probabilities of the respective evaluation values, the evaluation values of the sixth physical quantities and the probabilities of the respective evaluation values are outputted from the output layers of the learning model (5) and the learning model (6).

Similarly, histories such as a lifetime effective discharge capacity, a temperature cumulative value, a use period, and a lifetime effective overcharge capacity are inputted to the input layer of the learning model (7). The evaluation values of the seventh physical quantities and the probabilities of the respective evaluation values are outputted.

Similarly, histories such as a lifetime effective discharge capacity, a lifetime effective overcharge capacity, a temperature cumulative value, a use period are inputted to the input layer of the learning model (8). The evaluation values of the eighth physical quantities and the probabilities of the respective evaluation values are outputted from the output layers of the learning model (8).

Similarly, histories such as a lifetime effective charge capacity, a temperature cumulative value, a use period, a standing time, and a stay time in each SOC section are inputted to the input layer of the learning model (9). The evaluation values of the ninth physical quantities and the probabilities of the respective evaluation values are outputted from an output layer of the learning model (9).

Hereinafter, an estimation method for estimating the degree of deterioration will be described.

Figure 15:
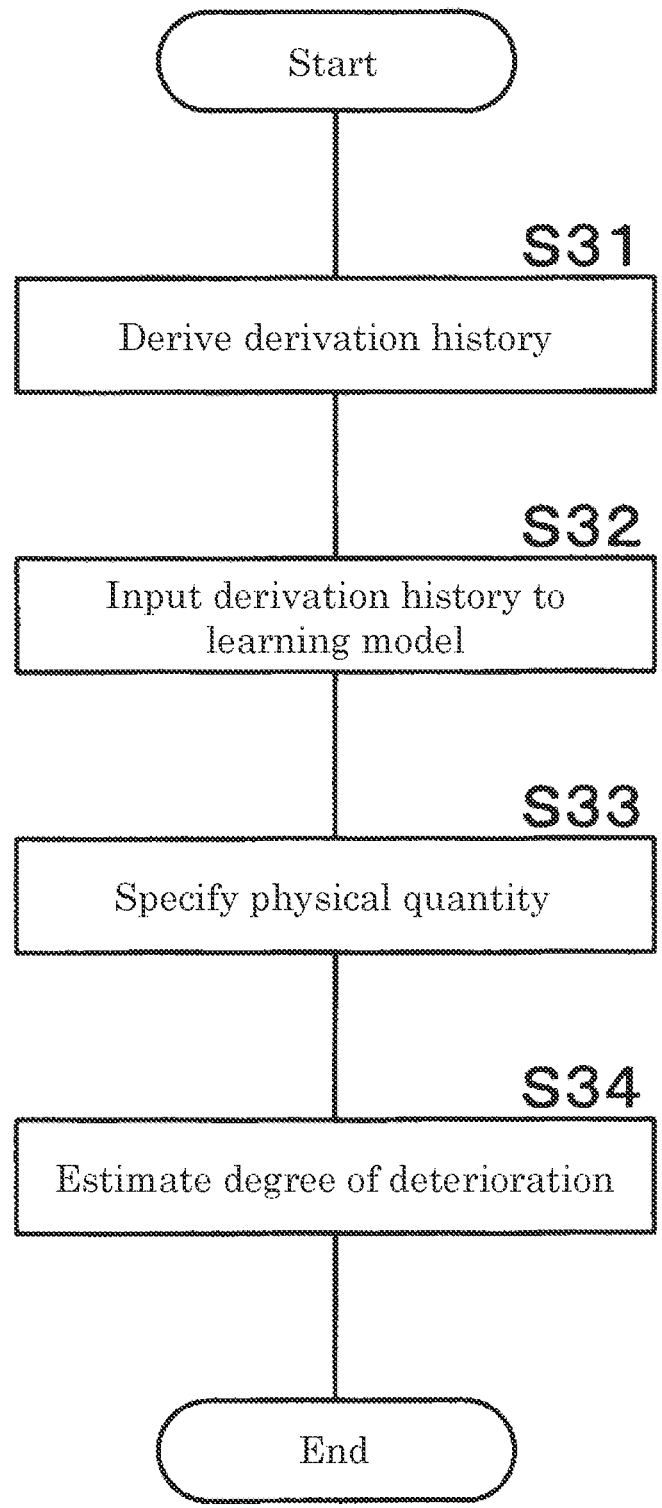
FIG. 15 is a flowchart illustrating steps of processing for estimating the degree of deterioration performed by the control unit.

FIG. 15 is a flowchart illustrating steps of estimation processing for estimating the degrees of deterioration performed by the control unit 71. The control unit 71 performs the following processing at predetermined points of time of estimation.

With respect to the battery 2 having the identification number No. 1, the control unit 71 derives derivation histories such as a lifetime effective discharge capacity, a temperature cumulative value, a use period based on a voltage, a current, and a temperature acquired at points of time of estimation, and stores the derivation histories in the use history DB 75 (S31).

The control unit 71 reads the learning model (1), and inputs the derivation histories to the learning model (1) (S32).

The control unit 71 specifies the first physical quantity having the highest probability among the first physical quantities outputted from the learning model (1), and stores the specified first physical quantity in the use history DB 75 (S33).

The control unit 71 estimates the degree of deterioration based on the specified first physical quantity (S34), stores the estimated degree of deterioration in the use history DB 75, and finishes the processing. The control unit 71 can estimate the degrees of deterioration based on the relationship between the first physical quantities and the degrees of deterioration derived from the degree-of-deterioration DB 74. A learning model may be generated using teacher data where the degrees of deterioration are associated with the first physical quantities, and the degree of deterioration may be acquired by inputting the specified first physical quantity to the learning model.

With respect to the second physical quantity, the third physical quantity, the fourth physical quantity, the fifth physical quantity, the sixth physical quantity, the seventh physical quantity, the eighth physical quantity, and the ninth physical quantity, similarly as described above, the use histories can be inputted to the learning models (2), (3), (4), (5), (6), (7), (8), and (9) respectively, at least one physical quantity is specified, and the degree of deterioration can be estimated based on the specified physical quantity. As described in the embodiments 1 and 2, the degrees of deterioration may be estimated by combining the first physical quantity, the second physical quantity, the third physical quantity, the fourth physical quantity, the fifth physical quantity, the sixth physical quantity, the seventh physical quantity, the eighth physical quantity, and the ninth physical quantity.

According to the embodiment, using the learning models (1) to (9), the degrees of deterioration factors can be easily and satisfactorily specified, and the deterioration of the battery 2 can be easily and satisfactorily estimated based on the degree of the specified deterioration factor. The learning models (1) to (9) are not limited to the above-described cases. Design information or diagnosis information may be inputted to the learning models (1) to (9) in addition to the derivation history.

Embodiment 4

A charge-discharge system 1 according to an embodiment 4 has substantially the same configuration as the charge-discharge system 1 according to the embodiment 1 except that at least one physical quantity out of a first physical quantity to a ninth physical quantity is specified based on a relationship between a history corresponding to a position of a plate in a height direction and a physical quantity at the position.

Hereinafter, an estimation method for estimating the degree of deterioration will be described.

FIG. 16 is an explanatory view illustrating one example of a record layout of a degree-of-deterioration DB 34.

The degree-of-deterioration DB 34 illustrated in FIG. 16 further stores a current collection characteristic column and an electrolyte solution specific gravity column as history columns in addition to the history columns illustrated in FIG. 5. The current collection characteristic column stores current collection characteristics of an upper portion, a middle portion, and a lower portion of each plate. In the current collection characteristics, the ease of charging and discharging is expressed by evaluation values in five grades. It is easiest to perform charging and discharging at the grade 1, and it is most difficult to perform charging and discharging at the grade 5. The electrolyte solution specific gravity column stores specific gravities of the electrolyte solution at an upper side, at a middle side, and at a lower side of each plate. The electrolyte solution specific gravity is expressed by evaluation values in five grades from 1 to 5. The grade 3 corresponds to the specific gravity at the beginning of the manufacture of the battery 2, the specific gravity is decreased as the numerical value is increased, and the grade 1 indicates a state where the specific gravity is increased by 4 to 6% as compared with the specific gravity at the beginning of the manufacture. The grade 5 indicates a state where the specific gravity is decreased by 4 to 6% as compared with the specific gravity at the beginning of the manufacture.

The fifth physical quantity column stores the evaluation values corresponding to the upper portion, the middle portion, and the lower portion of the plate. In the seventh physical quantity column, the evaluation values are stored corresponding to the upper portion, the middle portion, and the lower portion of the plate. The evaluation values of the fifth physical quantity and the seventh physical quantity are expressed by numerical values in six grades from 0 to 5 in the same manner as other physical quantities.

In the degree-of-deterioration column, the evaluation values are stored corresponding to the upper portion, the middle portion, and the lower portion of the plate. Furthermore, comprehensive evaluation values are stored.

The history stored corresponding to the upper, middle, and lower positions of the plate is not limited to the current collection characteristics and the electrolyte solution specific gravity.

The physical quantities on which the evaluation values are stored corresponding to the upper, middle, and lower positions of the plate are not limited to the fifth physical quantity and the seventh physical quantity.

Figure 17:
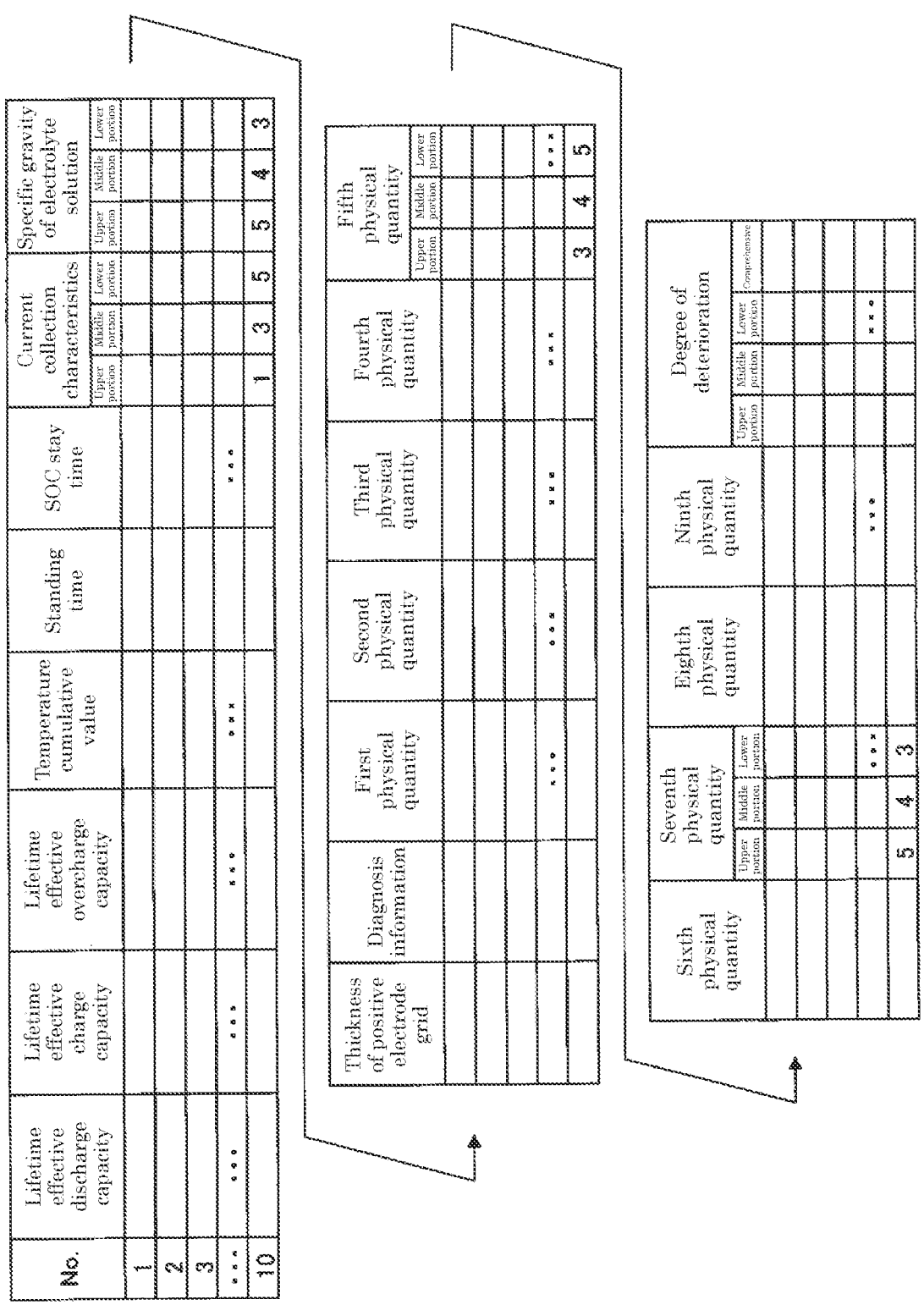
FIG. 17 is an explanatory view illustrating one example of a record layout of a use history DB.

FIG. 17 is an explanatory view illustrating one example of a record layout of a use history DB 35.

The use history DB 35 illustrated in FIG. 17 further stores a current collection characteristic column and an electrolyte solution specific gravity column as derivation history columns in addition to the derivation history columns illustrated in FIG. 6. The current collection characteristic column stores current collection characteristics of an upper portion, a middle portion, and a lower portion of each plate. The electrolyte solution specific gravity column stores specific gravities of the electrolyte solution at an upper side, at a middle side, and at a lower side of each plate.

The fifth physical quantity column stores the evaluation values corresponding to the upper portion, the middle portion, and the lower portion of the plate. In the seventh physical quantity column, the evaluation values are stored corresponding to the upper portion, the middle portion, and the lower portion of the plate.

In the degree-of-deterioration column, the evaluation values are stored corresponding to the upper portion, the middle portion, and the lower portion of the plate. Furthermore, comprehensive evaluation values are stored.

Figure 18:
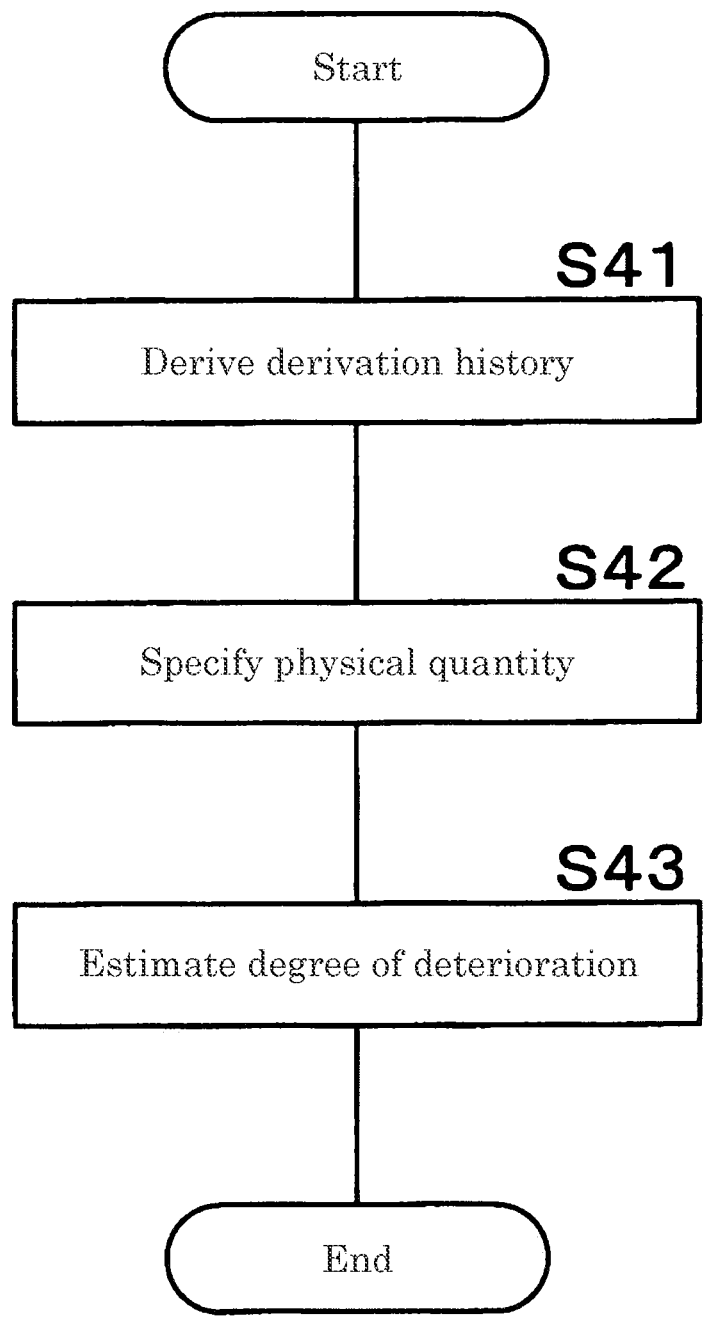
FIG. 18 is a flowchart illustrating steps of processing for estimating the degree of deterioration performed by the control unit.

FIG. 18 is a flowchart illustrating steps of estimation processing for estimating the degrees of deterioration performed by the control unit 31. The control unit 31 performs the following processing at predetermined points of time of estimation.

With respect to the battery 2 having the identification number No. 1, the control unit 31 derives derivation histories such as a lifetime effective discharge capacity based on a voltage, a current, and a temperature acquired at points of time of estimation, and stores the derivation histories in a use history DB 35 (S41).

The control unit 31 reads the degree-of-deterioration DB 34, specifies the first physical quantity based on the first relationship between the first history and the first physical quantity and the derivation history that are derived from the data of the degree-of-deterioration DB 34, and stores the specified first physical quantity in the use history DB 35 (S42). Similarly, the control unit 31 specifies the second physical quantity based on the second relationship between the second history and the second physical quantity and the derivation history that are derived from the data of the degree-of-deterioration DB 34, specifies the third physical quantity based on the third relationship between the third history and the third physical quantity and the derivation history that are derived from the data of the degree-of-deterioration DB 34, and specifies the fourth physical quantity based on the fourth relationship between the fourth history and the fourth physical quantity and the derivation history that are derived from the data of the degree-of-deterioration DB 34. The control unit 41 specifies the fifth physical quantities corresponding to the upper side, the middle side and the lower side of the plate based on the fifth relationship between the fifth history including the evaluation values on the current collection characteristics at the upper side, the middle side and the lower side of the plate and the fifth physical quantity and the derivation histories, and stores the specified fifth physical quantities in the use history DB 35. Similarly, the control unit 31 specifies the sixth physical quantities based on the sixth relationship between the sixth history and the sixth physical quantity and the derivation history. The control unit 31 specifies the seventh physical quantities corresponding to the upper side, the middle side and the lower side of the plate based on the seventh relationship between the seventh history including the evaluation values on the current collection characteristics at the upper side, the middle side and the lower side of the plate and the seventh physical quantity and the derivation histories. The control unit 31 specifies the eighth physical quantities based on the eighth relationship between the eighth history and the eighth physical quantity and the derivation histories. The control unit 31 specifies the ninth physical quantities based on the ninth relationship between the ninth history and the ninth physical quantity and the derivation histories. The control unit 31 stores the specified eighth and ninth physical quantities in the use history DB 35. The control unit 31 specifies at least one or more of the first physical quantity, the second physical quantity, the third physical quantity, the fourth physical quantity, the fifth physical quantity, the sixth physical quantity, the seventh physical quantity, the eighth physical quantity, and the ninth physical quantity.

The control unit 31 estimates the degree of deterioration from the physical quantity specified based on the relationship between at least one or more of the first physical quantity, the second physical quantity, the third physical quantity, the fourth physical quantity, the fifth physical quantity, the sixth physical quantity, the seventh physical quantity, the eighth physical quantity, and the ninth physical quantity and the degree of deterioration that are derived from data of the degree-of-deterioration DB 34, and stores the specified degree of deterioration in the use history DB 35 (S43), and finishes the processing.

When design information is also stored in the degree-of-deterioration DB 34, in step S42, the control unit 31 also specifies the first physical quantity based on the first relationship between the first history, the design information and the first physical quantity, and the derivation history. The first physical quantity may be corrected by the design information. Similarly, the second physical quantity to the ninth physical quantity are also specified based on the relationship between the second history to the ninth history, the design information, and the second physical quantity to the ninth physical quantity and the derivation history.

When diagnosis information is also stored in the degree-of-deterioration DB 34, the degree of deterioration may be corrected by the diagnosis information in step S43.

In the embodiment, the physical quantity can be specified corresponding to the position in the height direction, and the deterioration of the battery 2 can be estimated also in consideration of the difference in physical quantity in the height direction. Specifying of the physical quantity and the estimation of the degree of deterioration may be performed using a learning model.

The present invention is not limited to the contents of the above-described embodiments, and various modifications can be made within the scope defined by the claims That is, embodiments acquired by combining technical means that are appropriately modified within the scope defined by the claims are also included in the technical scope of the present invention.

DESCRIPTION OF REFERENCE SIGNS

1: charge-discharge system
2: battery (energy storage device)
3: BMU
31, 71, 91: control unit (derivation unit, specifying unit, estimation unit, history erasing unit)
32, 72: memory unit
33, 73: program
34, 74: degree-of-deterioration DB
35, 75: use history DB
36: input unit
37, 77, 92: communication unit
7: control device
76: learning model DB
9: server
10: network
13: load

The invention claimed is:

1. An estimation device comprising:
a derivation unit configured to derive a derivation history based on a current, a voltage of a lead-acid battery and a temperature of the lead-acid battery acquired at a point of time of an estimation;
a specifying unit configured to specify at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate,
based on the derived derivation history and at least one relationship selected from a group consisting of:
a first relationship between a first history based on a preliminary obtained current, a preliminary obtained voltage of the lead-acid battery or a different lead-acid battery and a preliminary obtained temperature of the lead-acid battery or the different lead-acid battery and the first physical quantity;
a second relationship between a second history based on the preliminary obtained current, the preliminary obtained voltage of the lead-acid battery or the different lead-acid battery and the preliminary obtained temperature of the lead-acid battery or the different lead-acid battery and the second physical quantity;
a third relationship between a third history based on the preliminary obtained current, the preliminary obtained voltage of the lead-acid battery or the different lead-acid battery and the preliminary obtained temperature of the lead-acid battery or the different lead-acid battery and the third physical quantity;

a fourth relationship between a fourth history based on the preliminary obtained current, the preliminary obtained voltage of the lead-acid battery or the different lead-acid battery and the preliminary obtained temperature of the lead-acid battery or the different lead-acid battery and the fourth physical quantity;

a fifth relationship between a fifth history based on the preliminary obtained current, the preliminary obtained voltage of the lead-acid battery or the different lead-acid battery and the preliminary obtained temperature of the lead-acid battery or the different lead-acid battery and the fifth physical quantity;

a sixth relationship between a sixth history based on the preliminary obtained current, the preliminary obtained voltage of the lead-acid battery or the different lead-acid battery and the preliminary obtained temperature of the lead-acid battery or the different lead-acid battery and the sixth physical quantity;

a seventh relationship between a seventh history based on the preliminary obtained current, the preliminary obtained voltage of the lead-acid battery or the different lead-acid battery and the preliminary obtained temperature of the lead-acid battery or the different lead-acid battery and the seventh physical quantity;

an eighth relationship between an eighth history based on the preliminary obtained current, the preliminary obtained voltage of the lead-acid battery or the different lead-acid battery and the preliminary obtained temperature of the lead-acid battery or the different lead-acid battery and the eighth physical quantity; and a ninth relationship between a ninth history based on the preliminary obtained current, the preliminary obtained voltage of the lead-acid battery or the different lead-acid battery and the preliminary obtained temperature of the lead-acid battery or the different lead-acid battery and the ninth physical quantity, and an estimation unit configured to estimate a degree of deterioration of the lead-acid battery based on the at least one specified physical quantity.

2. The estimation device according to claim 1, wherein the specifying unit is configured to specify the at least one physical quantity out of the first physical quantity to the ninth physical quantity based on the relationship between the history corresponding to a position of the plate in a height direction and the physical quantity at the position.

3. The estimation device according to claim 1, wherein the derivation history includes: an effective discharge capacity obtained by correcting a discharge capacity by a coefficient based on a temperature; an effective charge capacity obtained by correcting a charge capacity by a coefficient based on a temperature; or a temperature cumulative value obtained by multiplying a temperature by a predetermined coefficient.

4. The estimation device according to claim 1, wherein the specifying unit is configured to specify at least one physical quantity by inputting the derived derivation history into a first learning model, the first learning model is configured to output at least one physical quantity out of the first physical quantity, the second physical quantity, the third physical quantity, the fourth physical quantity, the fifth physical quantity, the sixth physical quantity, the seventh physical quantity, the eighth physical quantity, and the ninth physical quantity, when a derivation history based on a current, a voltage of a lead-acid battery and a temperature of the lead-acid battery is inputted to the first learning model.

5. The estimation device according to claim 1, wherein the estimation unit is configured to estimate a degree of deterioration by inputting the at least one specified physical quantity to a second learning model, the second learning model is configured to output a degree of deterioration of a lead-acid battery when at least one physical quantity out of the first physical quantity, the second physical quantity, the third physical quantity, the fourth physical quantity, the fifth physical quantity, the sixth physical quantity, the seventh physical quantity, the eighth physical quantity, and the ninth physical quantity is inputted to the second learning model.

6. The estimation device according to claim 1, wherein the specifying unit is configured to specify the at least one physical quantity based on the derivation history and design information on the lead-acid battery.

7. The estimation device according to claim 6, wherein the design information is at least one selected from a group consisting of;
a number of plates;
an amount of the positive active material;
a mass of the positive electrode grid;
a thickness of the positive electrode grid;
a design of the positive electrode grid;
density of the positive electrode material;
composition of the positive active material;
an amount and a kind of an additive in the positive active material;
a composition of a positive electrode alloy;
a presence or non-presence, a thickness, a material and gas permeability of a non-woven fabric that is brought into contact with the positive electrode plate;
an amount of negative active material;
an amount and a kind of carbon in the negative electrode material;
an amount and a kind of an additive in the negative electrode material;
a specific surface area of the negative electrode material;
a kind and concentration of an additive in an electrolyte solution; and a specific gravity and an amount of the electrolyte solution.

8. The estimation device according to claim 1, wherein the estimation unit is configured to estimate the degree of deterioration based on the at least one physical quantity and diagnosis information of the lead-acid battery.

9. The estimation device according to claim 8, wherein the diagnosis information is at least one selected from a group consisting of internal resistance, an open circuit voltage, and a state of charge (SOC).

10. The estimation device according to claim 8, further comprising:
a memory unit configured to store the derivation history, and the degree of deterioration or the diagnosis information that the specifying unit specifies; and
a history erasing unit configured to erase the derivation history, and the degree of deterioration or the diagnosis information, when determination is made that the lead-acid battery is exchanged based on the degree of deterioration or the diagnosis information, and a threshold value.

11. An estimation method comprising the steps of:
deriving a derivation history based on a current, a voltage of a lead-acid battery and a temperature of the lead-acid battery acquired at a point of time of an estimation;
specifying at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate, based on the derived derivation history and at least one relationship selected from a group consisting of:

a first relationship between a first history based on a preliminary obtained the current, a preliminary obtained voltage of the lead-acid battery or a different lead-acid battery and a preliminary obtained temperature of the lead-acid battery or the different lead-acid battery and the first physical quantity;

a second relationship between a second history based on the preliminary obtained current, the preliminary obtained voltage of the lead-acid battery or the different lead-acid battery and the preliminary obtained temperature of the lead-acid battery or the different lead-acid battery and the second physical quantity;

a third relationship between a third history based on the preliminary obtained current, the preliminary obtained voltage of the lead-acid battery or the different lead-acid battery and the preliminary obtained temperature of the lead-acid battery or the different lead-acid battery and the third physical quantity;

a fourth relationship between a fourth history based on the preliminary obtained current, the preliminary obtained voltage of the lead-acid battery or the different lead-acid battery and the preliminary obtained temperature of the lead-acid battery or the different lead-acid battery and the fourth physical quantity;

a fifth relationship between a fifth history based on the preliminary obtained current, the preliminary obtained voltage of the lead-acid battery or the different lead-acid battery and the preliminary obtained temperature of the lead-acid battery or the different lead-acid battery and the fifth physical quantity;

a sixth relationship between a sixth history based on the preliminary obtained current, the preliminary obtained voltage of the lead-acid battery or the different lead-acid battery and the preliminary obtained temperature of the lead-acid battery or the different lead-acid battery and the sixth physical quantity;

a seventh relationship between a seventh history based on the preliminary obtained current, the preliminary obtained voltage of the lead-acid battery or the different lead-acid battery and the preliminary obtained temperature of the lead-acid battery or the different lead-acid battery and the seventh physical quantity;

an eighth relationship between an eighth history based on the preliminary obtained current, the preliminary obtained voltage of the lead-acid battery or the different lead-acid battery and the preliminary obtained temperature of the lead-acid battery or the different lead-acid battery and the eighth physical quantity, and a ninth relationship between a ninth history based on the preliminary obtained current, the preliminary obtained voltage of the lead-acid battery or the different lead-acid battery and the preliminary obtained temperature of the lead-acid battery or the different lead-acid battery and the ninth physical quantity, and estimating a degree of deterioration of the lead-acid battery based on the at least one specified physical quantity.

12. A non-transitory computer-readable recording medium storing a computer program enabling a computer to execute processing comprising:

deriving a derivation history based on a current, a voltage of a lead-acid battery and a temperature of the lead-acid battery acquired at a point of time of an estimation;

specifying at least one physical quantity out of a first physical quantity of an amount of a positive active material, a second physical quantity of a specific surface area of a positive electrode material, a third physical quantity of bulk density of the positive electrode material, a fourth physical quantity of positive active material particles in a cluster size, a fifth physical quantity of a cumulative amount of lead sulfate of a negative electrode material, a sixth physical quantity of a specific surface area of the negative electrode material, a seventh physical quantity of a corrosion amount of a positive electrode grid, an eighth physical quantity of resistivity of a positive electrode plate, and a ninth physical quantity of resistivity of a negative electrode plate, based on the derived derivation history, and at least one relationship selected from a group consisting of:

a first relationship between a first history based on a preliminary obtained the current, a preliminary obtained voltage of the lead-acid battery or a different lead-acid battery and a preliminary obtained temperature of the lead-acid battery or the different lead-acid battery and the first physical quantity;

a second relationship between a second history based on the preliminary obtained current, the preliminary obtained voltage of the lead-acid battery or the different lead-acid battery and the preliminary obtained temperature of the lead-acid battery or the different lead-acid battery and the second physical quantity;

a third relationship between a third history based on the preliminary obtained current, the preliminary obtained voltage of the lead-acid battery or the different lead-acid battery and the preliminary obtained temperature of the lead-acid battery or the different lead-acid battery and the third physical quantity;

a fourth relationship between a fourth history based on the preliminary obtained current, the preliminary obtained voltage of the lead-acid battery or the different lead-acid battery and the preliminary obtained temperature of the lead-acid battery or the different lead-acid battery and the fourth physical quantity;

a fifth relationship between a fifth history based on the preliminary obtained current, the preliminary obtained voltage of the lead-acid battery or the different lead-acid battery and the preliminary obtained temperature of the lead-acid battery or the different lead-acid battery and the fifth physical quantity;

a sixth relationship between a sixth history based on the preliminary obtained current, the preliminary obtained voltage of the lead-acid battery or the different lead-acid battery and the preliminary obtained temperature of the lead-acid battery or the different lead-acid battery and the sixth physical quantity;

a seventh relationship between a seventh history based on the preliminary obtained current, the preliminary obtained voltage of the lead-acid battery or the different lead-acid battery and the preliminary obtained temperature of the lead-acid battery or the different lead-acid battery and the seventh physical quantity;
an eighth relationship between an eighth history based on the preliminary obtained current, the preliminary obtained voltage of the lead-acid battery or the different lead-acid battery and the preliminary obtained temperature of the lead-acid battery or the different lead-acid battery and the eighth physical quantity; and
a ninth relationship between a ninth history based on the preliminary obtained current, the preliminary obtained voltage of the lead-acid battery or the different lead-acid battery and the preliminary obtained temperature of the lead-acid battery or the different lead-acid battery and the ninth physical quantity; and
estimating a degree of deterioration of the lead-acid battery based on the at least one specified physical quantity.

* * * * *